United States Patent [19]

Mese et al.

[11] 4,291,334

[45] Sep. 22, 1981

[54] SYSTEM FOR DETECTING THE POSITION OF AN OBJECT

[75] Inventors: Michihiro Mese; Seiji Kashioka, both of Hachioji; Masakazu Ejiri, Tokorozawa; Takafumi Miyatake, Hachioji; Isamu Yamazaki, Tachikawa; Toshimitsu Hamada, Tokyo, all of Japan

[73] Assignee: Hitachi, Ltd., Tokyo, Japan

[21] Appl. No.: 797,848

[22] Filed: May 17, 1977

[30] Foreign Application Priority Data

May 19, 1976 [JP] Japan ................................. 51-56519

[51] Int. Cl.$^3$ ...................... H04M 7/00; G01B 11/00
[52] U.S. Cl. .................................... 358/101; 356/401
[58] Field of Search ..................... 358/101, 106, 107; 356/156, 157, 152, 400, 401, 402; 250/202; 340/146.3 H

[56] References Cited

U.S. PATENT DOCUMENTS

| | | | |
|---|---|---|---|
| 3,693,154 | 9/1972 | Kubo et al. ........................ | 358/101 |
| 3,903,363 | 9/1975 | Montone et al. .................... | 358/101 |
| 4,131,490 | 12/1978 | Oishi et al. ........................ | 358/101 |

OTHER PUBLICATIONS

R. F. Duffy et al., Automatic CCTV Positioning System 1-72 IBM Tech. Disclosure vol.-14-No. 8.

Primary Examiner—Jin F. Ng
Assistant Examiner—Edward L. Coles
Attorney, Agent, or Firm—Craig and Antonelli

[57] ABSTRACT

An apparatus for detecting the position of an object. The apparatus has an optical device for magnifying or enlarging a plurality of portions on the object, a photoelectric converter adapted for converting the enlarged portion image into electric signals, a plurality of thresholding circuits adapted for changing analogue signals from the respective photoelectric converter into binary signals with a threshold value determined by a signal level given by a first signal holding circuit, a circuit for calculating the threshold value from the analogue signals, a circuit for detecting the approximate position of a specific pattern in the enlarged portion images through a coarse sampling of the binary signals. A circuit for detecting the exact position of the specific pattern through measuring the area of a specific brightness in a plurality of regions in the enlarged portion images, by a fine sampling of the binary signals, and a controller for controlling the operations of respective circuits.

25 Claims, 43 Drawing Figures

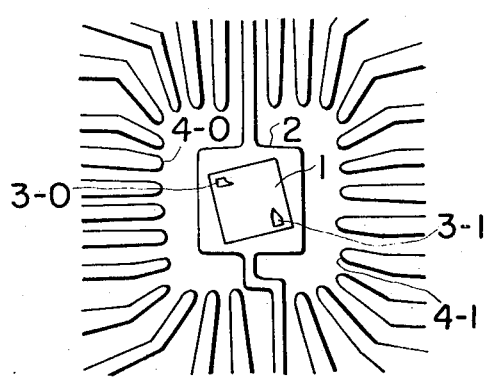
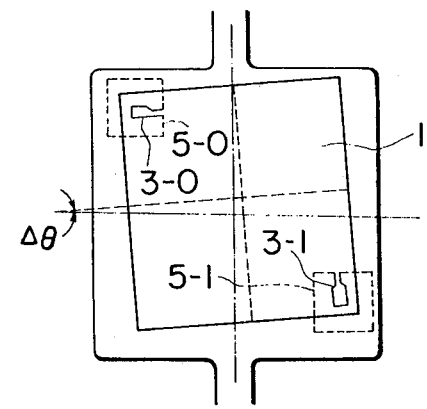
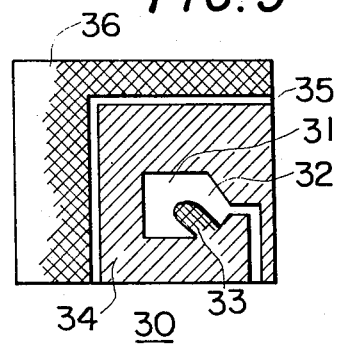
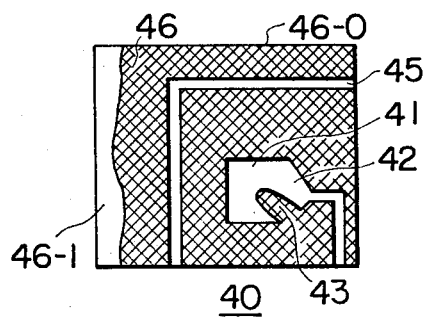
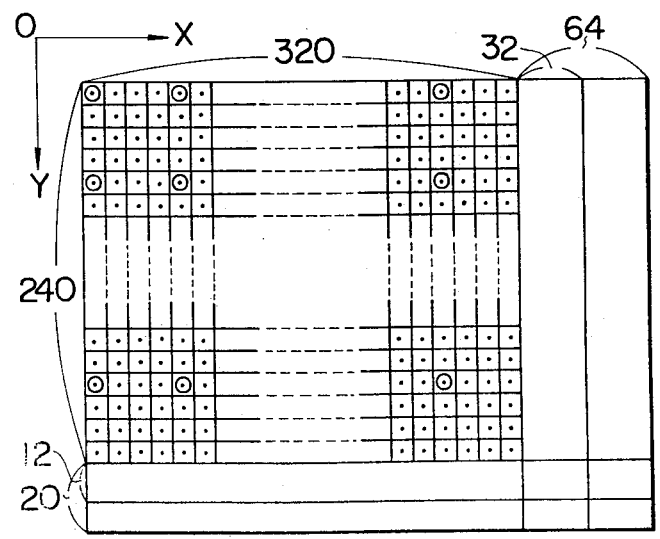

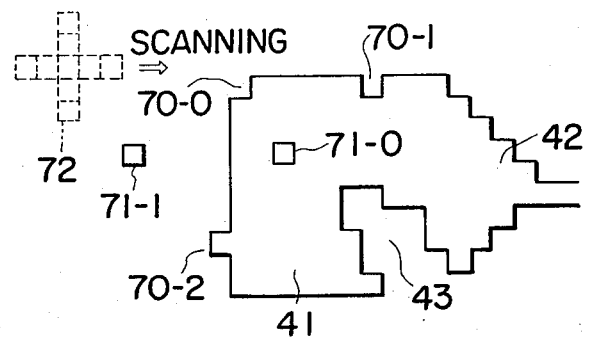
FIG. 10
FIG. 11
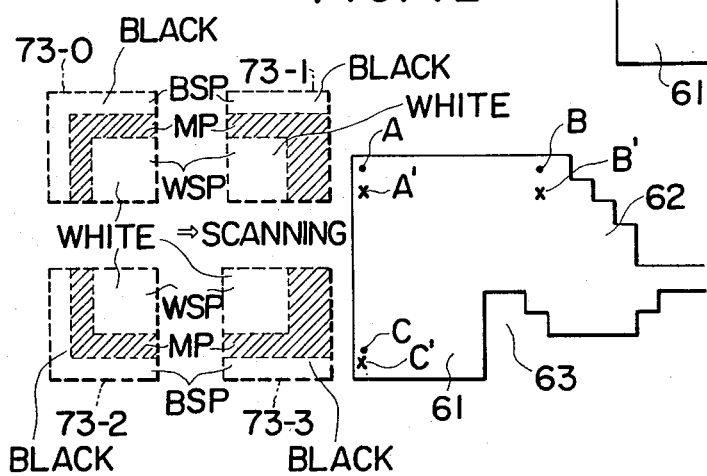
FIG. 12
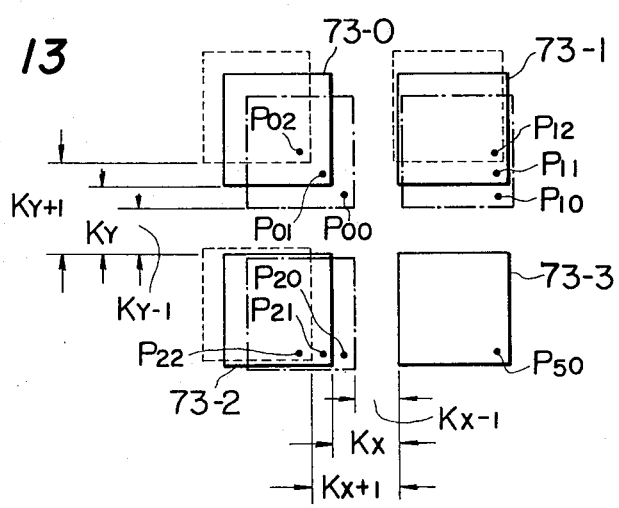
FIG. 13

SYSTEM FOR DETECTING THE POSITION OF AN OBJECT

BACKGROUND OF THE INVENTION

The present invention relates to a system for detecting the position of an object and, more particularly, to a system for detecting the position of an object suitable for use as a system for detecting the position for wire bonding which constitutes one of the steps of processes for assembling semiconductor products such as an integrated circuit (IC) or large scale integration (LSI).

In di-bonding processes for heat-bonding a chip onto a metal plate generally called a lead frame, the chip constituting semi-conductor integrated circuits such as IC or LSI, positional and rotational displacements of the chip are apt to take place.

To avoid inconveniences caused by these displacements, conventionally, operators have had to observe and measure the displacements by the naked eye.

However, this observation imparts a considerable mental stress to the operators, because of the highly integrated patterns, and, in addition disadvantageously prolongs the working time and is likely to cause errors in the measurements.

Such errors in the measurements directly lead to the reduction of the yield of the products and undesirably deteriorates the reliability of the products.

SUMMARY OF THE INVENTION

It is therefore an object of the invention to provide an automated system for detecting the position of an object which can automatically perform the detection of the position of an object at an enhanced speed and with an improved accuracy, and reliability.

To this end, according to the invention, there is provided first means for converting at least one portion image of an object into an electric signal, second means for detecting the approximate position of a specific pattern of the portion image converted into the electric signal, and third means for detecting the exact position of the specific pattern through examining the levels of brightness of the image in a plurality of regions within the image corresponding to the position detected by the second means.

The above and other objects, as well as advantageous features of the invention will become clear from the following description of preferred embodiments taken in conjunction with the attached drawings in which:

BRIEF DESCRIPTION OF THE DRAWINGS:

FIG. 1 is an illustration showing pellets of an IC or a LSI before a wire bonding, FIG. 2 is an illustration showing a visual field to be set on the pellets, FIG. 5 shows an analogue image obtained through a photo-electric converter, FIG. 6 shows a binary image of the image of FIG. 5, FIG. 7 shows an example of image sampling adopted in the present invention, FIG. 12 is an illustration showing the principle of a group pattern matching process, FIG. 13 is an illustration showing the assembling of templates for the group pattern matching process.

DETAILED DESCRIPTION OF THE PREFERRED EMBODIMENTS

Figure 3:
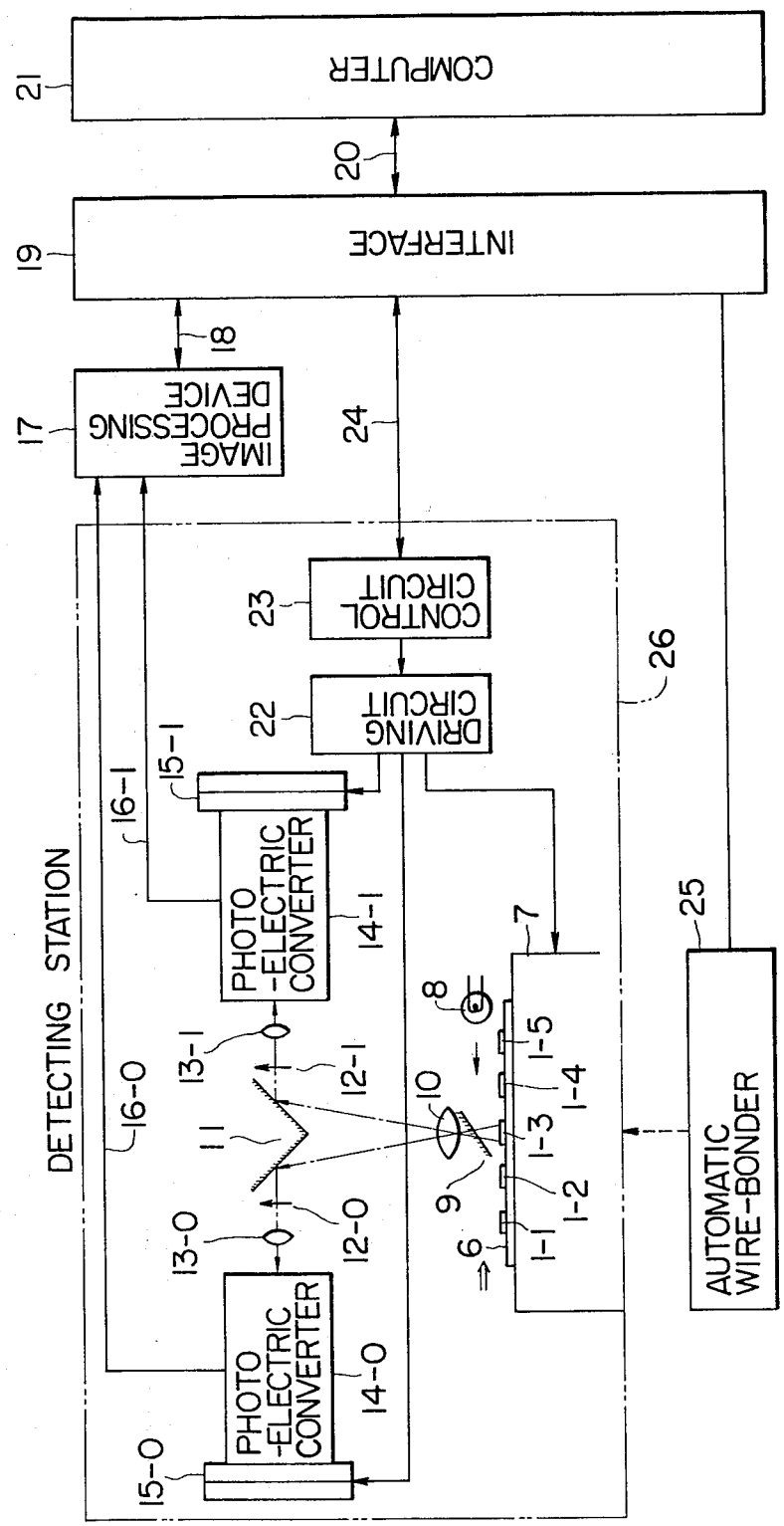
FIG. 3 shows the whole construction of a system for detecting position of an object, embodying the present invention.

Referring to FIG. 1 showing an array of semiconductor product such as an LSI chip, reference numeral 1 denotes a chip for an LSI or IC having a side length of 3 to 6 mm and having a base part 2. A plurality of bonding pads (referred to as "pad", hereinafter) 3-0, 3-1, . . . (only two 3-0, 3-1 of them are shown) are provided in the chip.

Outer electrodes 4-0, 4-1 constitute a part of a lead frame.

Practically, 20 to 40 pads 3, as well as the corresponding number of outer electrodes 4 exist. A pad 3 and an outer electrode 4 constituting a pair are connected to a lead wire made of a gold wire or an aluminum wire.

In this arrangement, a problem is raised by the fluctuation of the position (X, Y) of the chip and the rotation ($\theta$) of the chip. Typically, the displacements $\Delta X$ and $\Delta Y$ of $\pm 100$ to $150\mu$, as well as rotational displacement $\Delta\theta$ of 30' are observed.

For satisfactory automated wire bonding, it is necessary to detect the positions of the pads exactly, within an allowable range of error of $\pm 10\mu$.

To this end, according to the invention, at least two visual fields 5-0, 5-1 as shown in FIG. 2 are set at the peripheral portion of the chip where the pads exist, so as to detect the pads 3-0, 3-1 in the fields by pattern recognition.

A plurality of visual fields should be provided for detecting the rotational displacement $\Delta\theta$ of the chip, and may be more than two, although the description goes on with two visual fields for the purpose of simplification.

For covering any possible positional displacements $\Delta X$, $\Delta Y$, as well as the rotational displacements $\Delta\theta$, the field of vision should have sides of about $600\mu$ in length and should have variable positions.

In the embodiments of the invention described hereinunder, an arrangement is made to allow free choice of the positions of the visual fields, so as to enable the system to detect the pads in various chips of different sizes.

Referring to FIG. 3 showing an example of the basic arrangement of the position detecting system in accordance with the invention, a plurality of LSI chips 1-1 to 1-5 are disposed and crimped, at a constant pitch onto the tab section of a metal plate 6 called a lead frame. A frame feeder generally denoted by 7 is adapted to intermittently feed the lead frame 6 in the direction of the arrow, so as to bring the chips 1, one by one, beneath an optical detecting apparatus in accordance with the invention.

Numerals 8, 9 and 10 denote, respectively, a chip illumination lamp, a half transparent mirror and an objective lens for obtaining an enlarged image of the chip 1. A reflection mirror 11 for dividing the image is adapted to derive at least two portion images as shown in FIG. 2 from the enlarged image of the chip 1.

This arrangements provides enlarged real portion-images of parts of the chip 1, at positions denoted by 12-0 and 12-1.

Numerals 13-0 and 13-1 denote relay lenses, while numerals 14-0 and 14-1 designate photo-electric converters for scanning the optical image to convert it into a timed analogue video signal. The photo-electric converter may be constituted by, for example, a TV camera such as a vidicon.

Numerals 15-1 and 15-0 are X, Y tables for moving the photo-electric converters in a plane in parallel with their light-receiving surfaces, thereby to provide different positioning of the visual fields depending on the nature of the chips 1.

Analogue video signals from the photo-electric converters are denoted by 16-0 and 16-1 which are turned to binary signals by image processing device 17. The device 17 also performs pad detecting processing and other functions.

A controller 21, which may be a computer, is adapted to perform, through signals 18 and 20 transmitted across an interface 19, various functions such as data processing for the pad detecting, controlling of the image processing device 17 and the like.

Numeral 22 denotes generally, a driving circuit for driving the frame feeder 7 and the X Y tables 15-0 and 15-1.

A controlling circuit 23 for controlling the driving circuit 22 is adapted to be actuated by the signal 20 output from the computer 21 through the interface 19.

The computer determines the positions of all of the pads, from the positions obtained through the image processing device 17, so as to impart an adequate order to an automatic wire bonder 25 to allow correct bonding of the pad and the outer electrode through the metal wire.

The automatic bonder may be constituted by a buffer such as a cassette tape remembering the data obtained by the computer 21, with a detecting station 26 connected to the automatic wire bonder through off-line, when the speed of the detection of the positions and the speed of the automatic bonding do not match each other.

Figure 4:
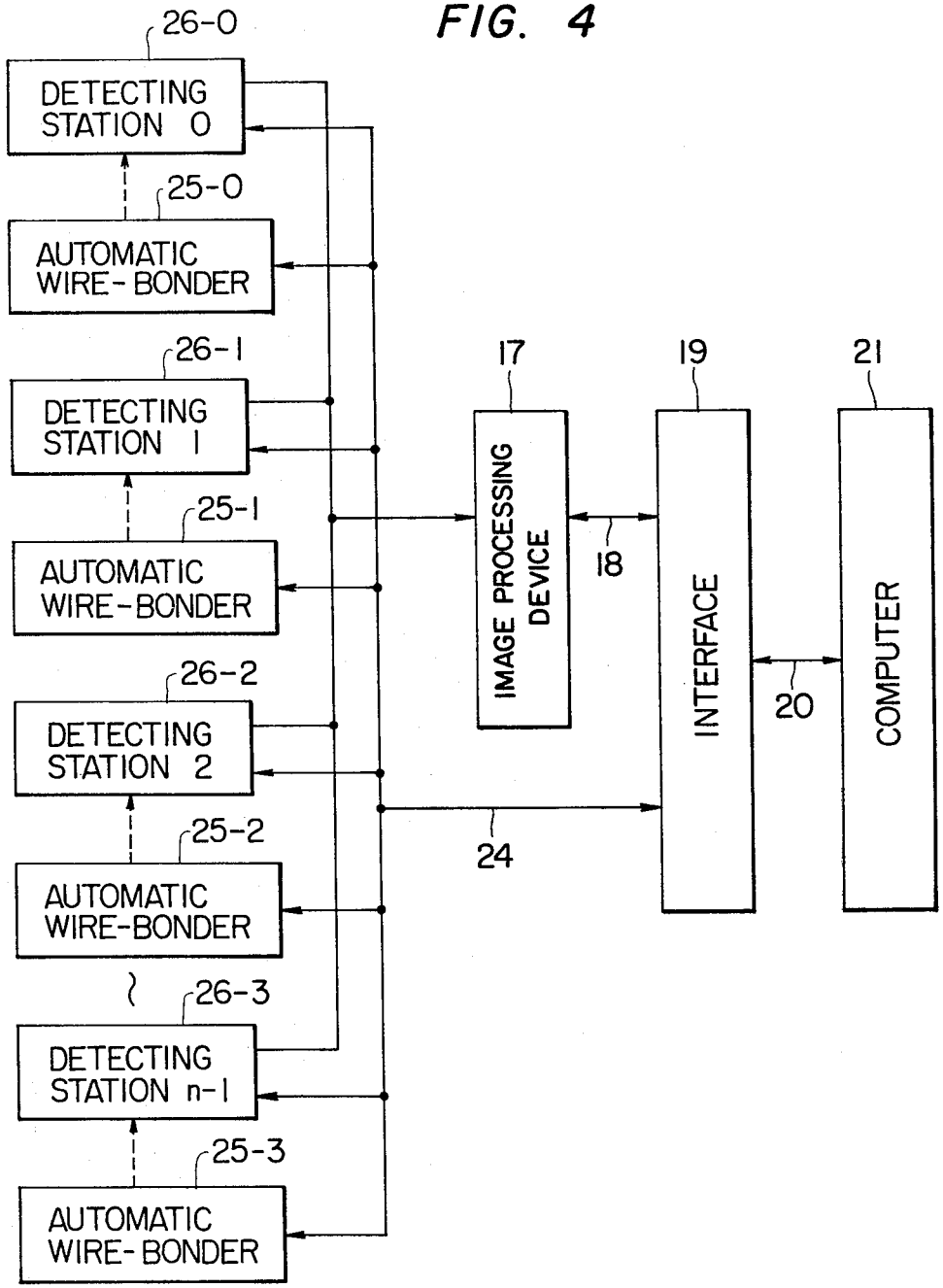
FIG. 4 shows the whole structure of the system for detecting the position of an object which is another embodiment of the present invention.

Provided that the speed of detection of the positions is sufficiently larger than the bonding speed, the arrangement may be such that only one set of the image processing device 17 and the computer 21 is used for a plurality of detecting stations 26-0 to 26-3 and the corresponding automatic wire bonder 25-0 to 25-3, as shown in FIG. 4.

In the embodiment now described, four detecting stations are managed by one set of the image processing device 17 and the computer 21.

The numeral 24 denotes a signal between the detecting station 26 and the interface 19.

The image processing device in the system of the invention will be outlined hereinunder.

Referring to FIG. 5, numeral 30 denotes an analogue representation of an enlarged portion image of an LSI chip, obtained through a photo-electric converter such as a TV camera. The square part denoted by 31 shows an aluminum pad, numeral 32 denotes a joint terminal with inner patterns.

At the preceding wafer inspection stage, every bonding pad is scratched by a needle probe, 33 designates a scratched portion.

Although LSI chips of different sizes are available, they have almost a common size of the square portion of the pad, typically having a side length of 120μ or so.

The joint terminal with the inner pattern 32 may project from either one of the four sides, depending on the kinds of the LSI and the positions of the visual fields within the chip.

The portions scratched by the probe have almost equal width, but are dispersed at random within the pad.

The peripheral portion 34 of the pad 31 constitutes a coating part of silicon oxide and 35 denotes a silicon portion at the edge of the chip, while 36 denotes a gold-silicon eutectic part outside of the chip.

In case of the vertical illumination from the upper side, as shown in FIG. 3, the aluminum portion 31 exhibits the highest brightness, while the silicon part 35 and the silicon oxide part 34 show the intermediate and the lowest brightness.

The gold-silicon eutectic part 36 exhibits a brightness, due to an inclination of the optical axis, which is smallest at regions close to the chip where the inclination is relatively large and increases as it gets remote from the chip. The recessed scratched portion 33 is dark.

Referring to FIG. 6, numeral 40 denotes a binary image of the analogue image 30 of FIG. 5, trimmed with a threshold value corresponding to the brightness between the brightness of the aluminum portion and that of the silicon-oxide portion. As will be seen from the illustration, the pad 41, junction terminal 42, silicon portion 45, regions of the gold-silicon eutectic portion 46-1 remote from the chip form a "white" area, while the scratched portion 43, silicon oxide portion 44, regions 46-0 of the gold-silicon eutictic portion 46 constitute a dark or black area (hatched).

This conversion of the analogue signal into binary signals promises a relatively simple apparatus. Thus, in the following description, the object to be processed is in the form of the binary video signal. At the same time, for further facilitating the electric processing of the images, according to the invention, the binary video signals are sampled into 320 picture elements in the X direction and 240 picture elements in the Y direction. A portion defined by right-hand side 64 elements in X direction and lower most 20 elements corresponds to blanking period. The belt-shaped portion spreading over 32 picture elements in the X direction and 12 picture elements in the Y direction is for outer synchronizing signal of TV camera.

The manners of sampling of lattice points for every one picture element, every two picture elements and so on, in both directions X and Y, will be referred to as "mode 1", "mode 2" and so on, respectively.

In FIG. 7, the symbol ⊙ denotes a sampling of the mode 1, while symbol   denotes the sampling of mode 4.

The basic image processing for detecting the position of the pad consists of, according to the invention, four steps of (1) threshold calculation processing for binary, (2) macroscopic processing, (3) direction checking and (4) microscopic processing. Additional steps of (5) decision of the position of a pad in a plurality of visual fields and (6) calculations of the positions of all pads are also performed.

The first step (1) is to turn the video signal into binary signal through a threshold value corresponding to the intermediate brightness between those of the aluminum portion and the silicon oxide portion, as mentioned before. The step (2) is for obtaining an approximate position of the pad, while the step (3) is to check whether the pad detected in the step (2) has the joint terminal in the expected direction. The step (4) is to obtain the position of the pad as detected by the step (2) more exactly.

These steps (1) to (4) are performed by an image processing circuit which will be detailed hereinafter. The data processing required for respective processing of these steps are performed by a computer software, while the processing of the steps (5) and (6) is performed entirely by the computer software.

The image processing as stated above is supposed to be performed in a stationary period of the intermittently fed chip. Thus, during this period, the same video signal is obtained repeatedly from the photo-electric converter such as a TV camera.

Now, the manners of processings of the steps (1) to (4) will be described.

Figure 8:
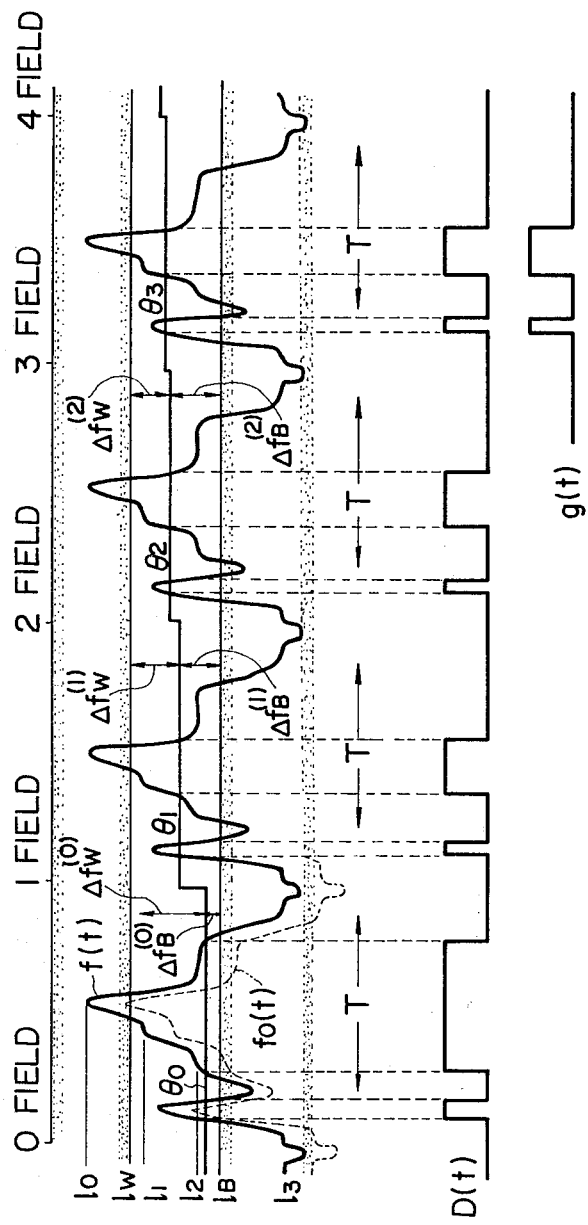
FIG. 8 is an illustration showing a theory of threshold calculation performed in the system of the invention.

FIG. 8 show the manner of the threshold calculation. In this Figure, symbols $f_o(t)$ and $f(t)$ schematically show analogue video signals obtained through a TV camera. It is supposed here that the signal $f_o(t)$ has been changed to $f(t)$ as a result of a drift. Since the chip is kept stationary, as aforementioned, the signal $f(t)$ may be considered as a periodical one having a period of 16.7 ms corresponding to 1 field.

In the drawings, symbols $l_0$, $l_1$, $l_2$ and $l_3$ represent the signal levels of portions of an extremely high brightness, aluminum portion, silicon oxide portion and an extremely dark portion, respectively.

The portion of the extremely high birghtness are mirror reflective components residing in the aluminum portion and the gold-silicon eutectic portion, in case of illumination from the upper side, while the extremely dark portion corresponds to the shadow portion of the gold-silicon eutectic portion close to the chip. These levels of signal are preferably neglected, in view of the purpose to obtain the binary signal.

To this end, two threshold level $l_B$ and $l_W$ are determined for drawing upper and lower adoptable level lines. Then, a threshold value $\theta_{n-1}$ is temporarily determined, within the range of between the $l_B$ and the $l_W$. Then, average video signal levels within above range are obtained respectively for the level above and below the temporarily determined threshold.

Finally, a new threshold value is obtained, in accordance with the average video signal levels in the follownig manner.

Namely, the new threshold value is obtained for each value of n(1, 2, ... N) from the following equation (1)

$$\theta_n = \theta_{n-1} + \gamma\{\beta\Delta f_W^{(n-1)} - (1-\beta)\Delta f_B^{(n-1)}\} \quad (1)$$

where $$\Delta f_W^{(n-1)} = \sum_{t \in t_{W(n-1)}} (f(t) - \theta_{n-1}) / \sum_{t \in t_{W(n-1)}} \quad (2)$$

and $$\Delta f_B^{(n-1)} = \sum_{t \in t_{B(n-1)}} (\theta_{n-1} - f(t)) / \sum_{t \in t_{B(n-1)}} \quad (3)$$

In the above equations, $\beta$ and $1-\beta$ are weights for $\Delta f_W^{(n-1)}$ and $\Delta f_B^{(n-1)}$, respectively, while $\gamma$ is a coefficient for compensating for the correction of the threshold value at the second term of the right-hand side of the equation (1). $t_{W(n-1)}$ and $t_{B(n-1)}$ are region of time which satisfy, respectively, $\theta_{n-1} \leq f(t) \leq l_W$ and $\theta_{n-1} \geq f(t) \geq l_B$. By this calculation, it is possible to determine the threshold value $\theta_n$ for dividing the signals within the level of between $l_1$ and $l_2$ to $\beta:(1-\beta)$, at a region of $N \geq 3$. For the unit of n, 1 field time (about 16.7 ms) is used, in case that a TV camera is used as the photo-electric converter.

At the same time, in the drawing, D(t) represents the binary signals obtained by thresholding the analogue signal by each threshold value of $\theta_n$ (n being 1, 2, 3), while g(t) represents the binary signal obtained by thresholding the analogue signal by the final threshold value $\theta_3$.

The threshold value for the binary signal can be obtained more exactly, when the signals out of the time duration T are removed by a suitable masking.

For adopting only the signals obtained within a predetermined region of time in processing, a "domain gate processing" is used in the described embodiment. More specifically, by the "domain gate processing", only the signals within a rectangular domain on the image surface corresponding to the time region T are picked up for the purpose of processing. The rectangular domain is determined by the position of the left-hand side upper corner of the rectangular shape and the lengthes of the sides in the X and Y directions.

Since a relatively coarse sampling suffices for the above determination of the threshold value, it is supposed that a mode 4 sampling is adopted in the described embodiment.

Above stated processing ensures a stable follow-up of the threshold value to a drifting analogue video signal, even when the drift is taking place, to provide a reliable binary signal.

Figure 9:
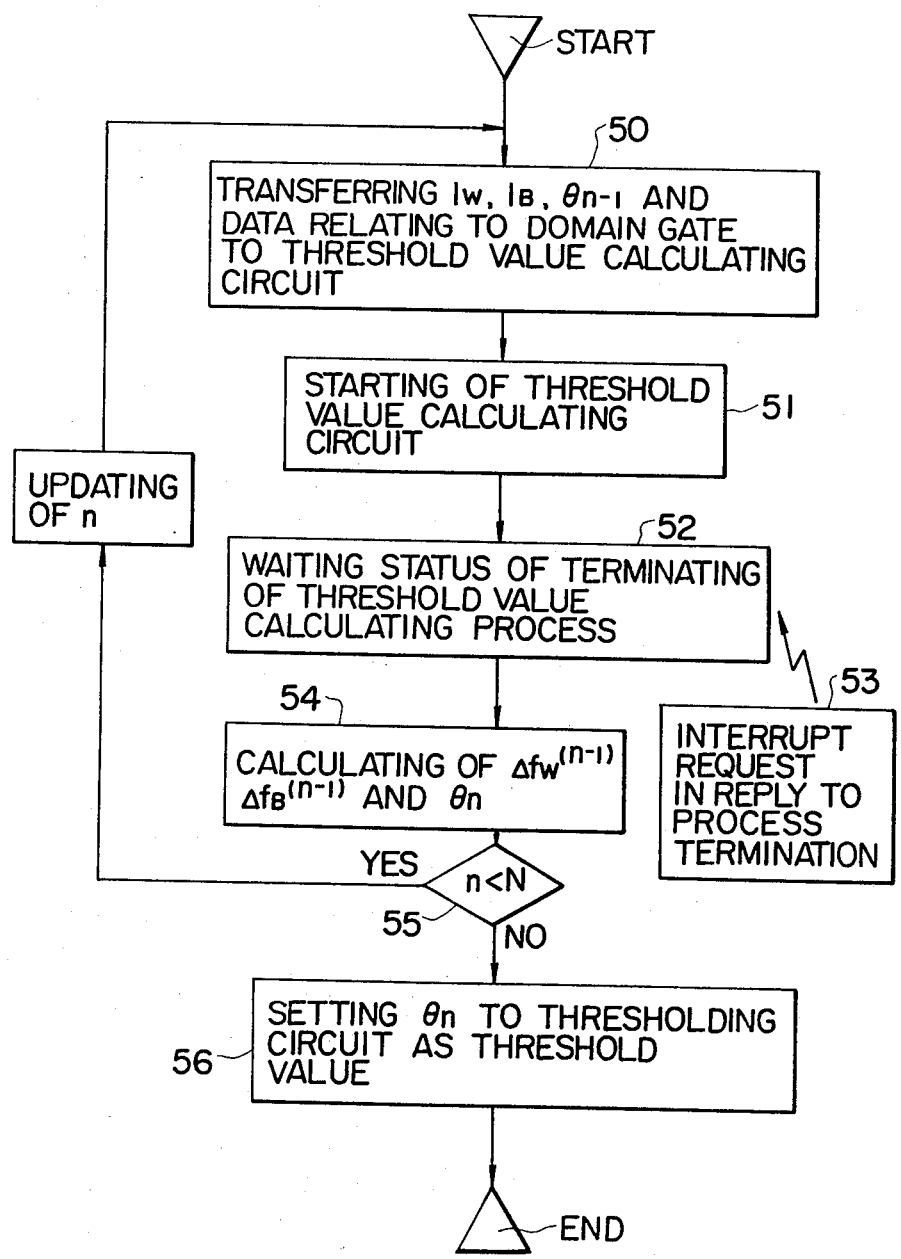
FIG. 9 shows a flow chart of a process for performing the threshold calculation of FIG. 8, FIGS. 10 and 11 are an illustrations showing the principle of a noise elimination process.

FIG. 9 shows the manner of a computer-software processing for performing the above stated calculation for determining the threshold value for obtaining the binary signal.

Data required for the processing in the threshold calculation circuit are given at a block 50. The threshold calculation circuit which will be detailed later is started at a block 51. Then, the computer is kept at a stand-by condition waiting for the completion of the processing, as at the block 52. During this stand-by period, the computer may be provided with other task, so that the total processing time may be shortened.

The block 53 represents an interrupt request from the threshold calculation circuit by the termination of the processing, when the scanning comes out from the domain gate provided by the block 50, i.e. when the time region T of FIG. 8 has been passed, so as to allow the computer to start the processing of the block 54, i.e. the calculations of the $f_W^{(n-1)}$, $f_B^{(n-1)}$, and the $\theta$. The block 55 represents a processing for deciding the number of repetition of the threshold calculation. Thus, the block 55 orders to repeat the threshold calculation when n is smaller than N with a updated value of n, and allows to advance to the subsequent processing by the block 56 when n has reached N. This processing by the block 56 is to transfer the obtained threshold value to a thresholding circuit, which will be described later.

The above stated processing consisting in transferring the data required for the processing from the computer to the processing circuit to start it and then allowing the computer to perform other tasks during it is waiting for the interrupt request by the termination, constitutes the basic form of the image processing of the present invention having four steps (1) to (4) of processing as aforementioned. This basic form affords maximum utilization of the computer to allow a high speed operation. More specifically, a plurality of detecting stations can be managed commonly, by only one set of the computer and the image processing circuit.

The way of macroscopic processing will now be described. According to the invention, two circuits of (a) noise elimination circuit and (b) group pattern matching circuit are concerned with the macroscopic processing.

The noise elimination circuit (a) is for treating noises and quantization errors in the binary video signal, while the group pattern matching circuit (b) is for obtaining an approximate position of the pad.

Since extreme accuracy is not required for both of the circuits (a) and (b), the mode 4 sampling suffices as will be described hereinafter. The processing by the circuit (a) can be neglected, when the noises in the video signal are not so serious.

Referring now to FIGS. 10 and 11 showing the way of the noise elimination by the circuit (a), a pattern as shown in FIG. 10 is obtained as a result of a 4 mode sampling over the binary video signal of the pad as shown in FIG. 6. This pattern contains quantization errors at the boundary as at 70-0, 70-1 and 70-2, as well as minor noises at 71-0 and 71-1.

In this connection, it is to be noted that the pattern of the LSI chip consists of components which are in parallel to either one of the directions X and Y, excepting the scratched portion 43 and the joint terminals 42. Therefore, the pattern as shown in FIG. 11 can be obtained, when such a processing is made that the sampling picture element at the center of a cross-shaped domain having lengths of i picture elements in the X and Y directions is judged to be "white" when the domain contains more that $i-1$ white picture elements, while the sampling picture element is judged to be black when the domain contains less than $i-1$ white sampling elements.

Reference numerals 61 to 63 correspond to the numerals 41 to 43, respectively. The Figure illustrate the case in which the i is selected to be 5.

As will be seen from FIG. 11, the quantization errors and the minor errors can be eliminated. However, when too large a number is selected for i, the shape of the pad may be disadvantageously deformed, especially when many noises exist near the pad. Thus, for an LSI chip, the i is preferably 5.

Referring now to FIG. 12 showing the way for the group pattern matching processing by the circuit (b), four square templates 73-0 to 73-3 each of which has lengthes in X and Y directions of 5 picture elements are supposed. The image or video surface after the elimination of the noises is scanned by these four square templates, with the relative positions of the square templates kept constant with each other, i.e. with the square templates being unitary with one another. Then, coincidence of the object pattern in each template with a standard mask pattern which consists of illustrated white and black standard patterns WSP and a mask pattern MP is judged. The object pattern is judged to be of the object pad, when the coincidence is obtained in more than 3 templates, within the appointed domain gate.

Supposing a pad 61 having a scratch 63 by a prober at the right-hand side lower corner, as illustrated in the right-hand section of FIG. 12, the coincidences are obtained when the center of the templates 73-0, 73-1 and 73-2 pass characteristic points A,B and C, so that a signal representative of the detection of the pattern may be issued at that moment of the passage.

Representing the white and black standard patterns in respective templates, the mask pattern, a point on the quantized video surface and the object pattern in a template U corresponding to the point by, respectively, S(u,v), M(u,v), (X,Y) and I(X+u, Y+v), the coincidence of the patterns is obtained when the following logical function P(X,Y) does exist.

$$P(X,Y) = \overline{\sum_{(u,v) \in U} (S(u,v) \oplus I(X+u, Y+v) \wedge M(u,v))},$$

where $\oplus$ represents an exclusive OR, $\wedge$ represents a logical AND, $$\sum_{(u,v) \in U}$$

represents a logical OR of the all sampling pictural informations in the template U, and bar—represents a logical NOT. The state of masking is represented by M="0".

As shown in the drawings, a mask pattern of a breadth corresponding to one picture element is provided between the "white" and "black" standard patterns, for avoiding the influence of large quantization error which could not be removed by the aforementioned noise elemination and of the inclination of the pad due to a possible rotational displacement of the chip.

The distances between the templates in the X and Y directions are determined in accordance with the size of the pad, i.e. the magnification of the detecting system.

The distances $K_x$ and $K_y$ are preferably 3 sampling picture elements, when the templates have lengthes of 5 elements in the X and Y directions.

In order to get rid of the large quantization errors which cannot be removed even by the above mask pattern, as well as the influence of the inclination of the pad and the deflection in the TV camera and the optical system, according to the invention, the distances between the templates are, as shown by chain line and broken line of FIG. 13, determined to be $K_x \pm 1$ sampling elements, and $K_y \pm 1$ sampling elements, in the X and Y directions, so as to afford a group pattern matching decision in which the distances simultaneously satisfy $(K_x, K_y)$, $(K_{x-1}, K_{y-1})$ and $(K_{x+1}, K_{y+1})$.

By providing the distances between the templates with the breadth of allowance as stated above, all of the pads are detected somewhat larger in number than actual.

Namely, not only the extraction points A, B and C in FIG. 12, but also the points A', B' an C' which are close to and inside of the points A, B and C are extracted. Similarly, in the example of FIG. 13, for a point $P_{30}$ in the template 73-3, combinations of points $(P_{01}, P_{11}, P_{21})$ and points $(P_{02}, P_{12}, P_{22})$ are extracted, in addition to the combination of the points $(P_{00}, P_{10}, P_{20})$ of the other of the other three templates.

Figure 14:
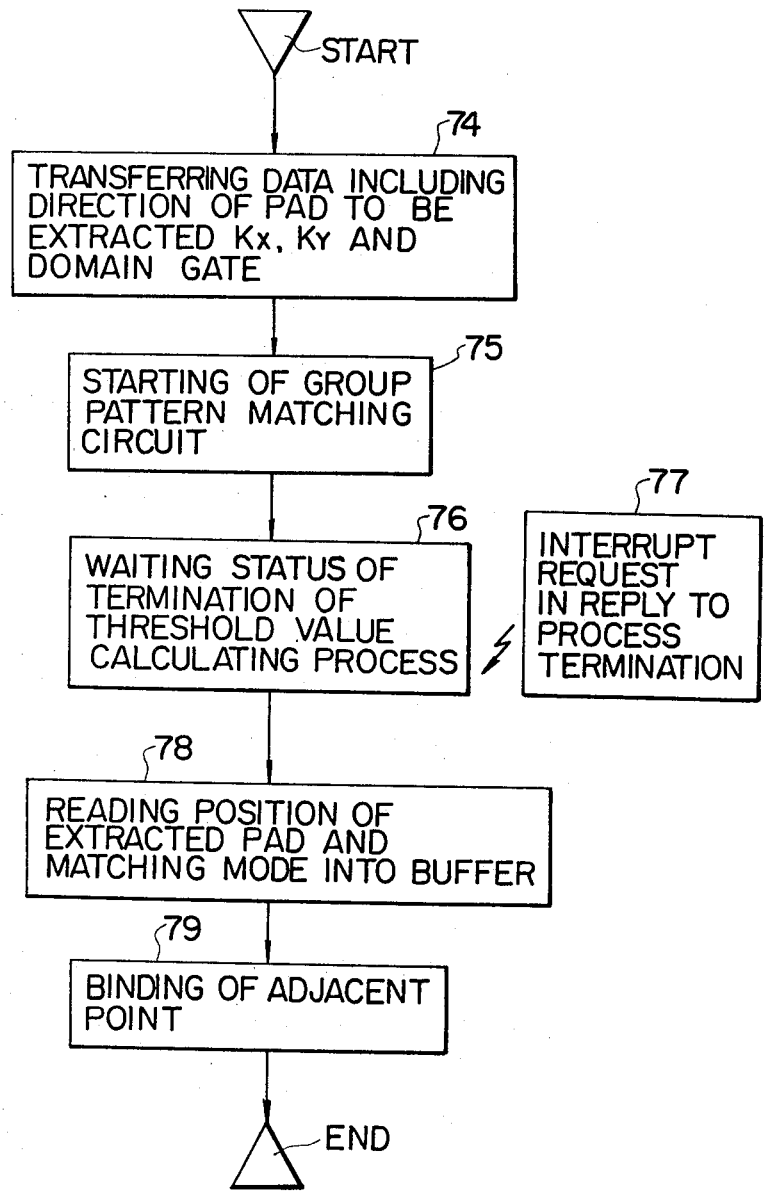
FIG. 14 is a flow chart for the group pattern matching process.

Thus, in the group pattern matching circuit, the positions of the extracted pads and the manner of extraction, i.e. by what modes of distances between the templates and in what templates of four templates the matching was obtained (this will be referred to as a decision of matching mode) are stored in a buffer memory. Then, a binding processing is performed by the computer software, to regard the two points close to each other as shown in FIG. 13 as being identical. Thus, the operation of the computer software as shown in FIG. 14 is perforemd.

Namely, a block 74 transfers the direction of the pad to be processed, $K_x$ and $K_y$, as well as data of domain gate, to the group pattern matching circuit. A block 75 then initiates the matching circuit. Block 76 is waiting for the termination of the group pattern matching processing.

As is the case of the aforementioned threshold calculation, the group pattern matching circuit performs the extraction of the pad, during this waiting or stand-by period, and the stand-by state is dismissed when a block 77 provides an interrupt request by the termination of the processing, so as to advance the processing to the next step of a block 77 in which the aforementioned reading into the buffer and the binding are performed.

Figure 15:
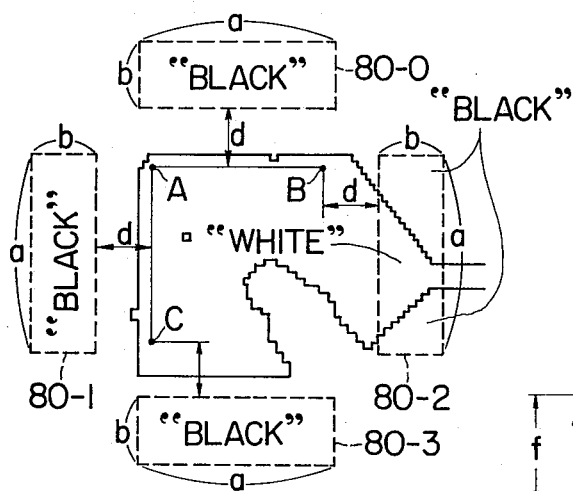
FIG. 15 is an illustration showing the principle of a direction checking process.

Referring now to the process of direction checking of the aforementioned step (3), shown in FIG. 15, a mode 1 sampling is made as illustrated. Four rectangular domains 80-0 to 80-3 are supposed outside of the characteristic points A, B and C obtained through the macroscopic processing of the step (2), spaced from these characteristic points in four directions by a distance corresponding to d sampling picture elements, each rectangular domain having a longer and a shorter sides of a length corresponding respectively to a and b sampling picture elements. The number of white sampling picture elements is counted to provide the white area in each domain. Then a decision is made as to whether the white area in a rectangular domain 80-2 located in the predetermined direction (rightward direction in the example illustrated) is larger than a first threshold values $S_o$ and whether the white areas in other three domains are all smaller than a second threshold value $S_o'$. As a result of this decision, the pad erroneously detected in the group pattern matching processing in the step (2) can fairly be rejected.

In the system of the invention, the processing for counting the white areas in the four domains is made by a computer hardware, while the other processing is performed by the computer software.

Preferably, a plurality of white area counters are provided to act in parallel with each other, for obtaining a higher speed of the above direction checking processing.

In another embodiment which will be mentioned later, a white area counter group consisting of four white area counters is used, so as to appoint, for example, a domain gate as shown by the broken line in FIG. 16 and a rectangular domain as shown by full line for counting the white area.

Namely, the SA point is set at above the coordinates of all white area counting rectangular domains. The coordinates of the left-hand side corner $S_o$ to $S_3$, as well as the X and Y lengthes of the rectangles ($a_o$, $b_o$) to ($a_3$, $b_3$) are given on the basis of the SA point.

Thus, coordinates of SA, $S_0$, $S_1$, $S_2$ and $S_3$ are given, respectively, by $(X_s, Y_s)$, $(X_s+X_{s0}, Y_s+Y_{s0})$, $(X_s+X_{s1}, Y_s+Y_{s1})$, $(X_s+X_{s2}, Y_s+Y_{s2})$ and $(X_s+X_{s3}, Y_s+Y_{s3})$.

This affords an automated determination of the point SE by the white area counter group, after the termination of scanning corresponding to the all rectangular domains, so as to make the inside of the broken line of Figure a domain gate.

This arrangement allows, when there are a plurality of domain gates spaced in the Y direction, the white area counter group to start again, after the scanning point has passed the point SE. Thus, it becomes possible to perform the processing of a plurality of white area counter groups in a common video surface, within a real time, i.e. within the same field.

Figure 17:
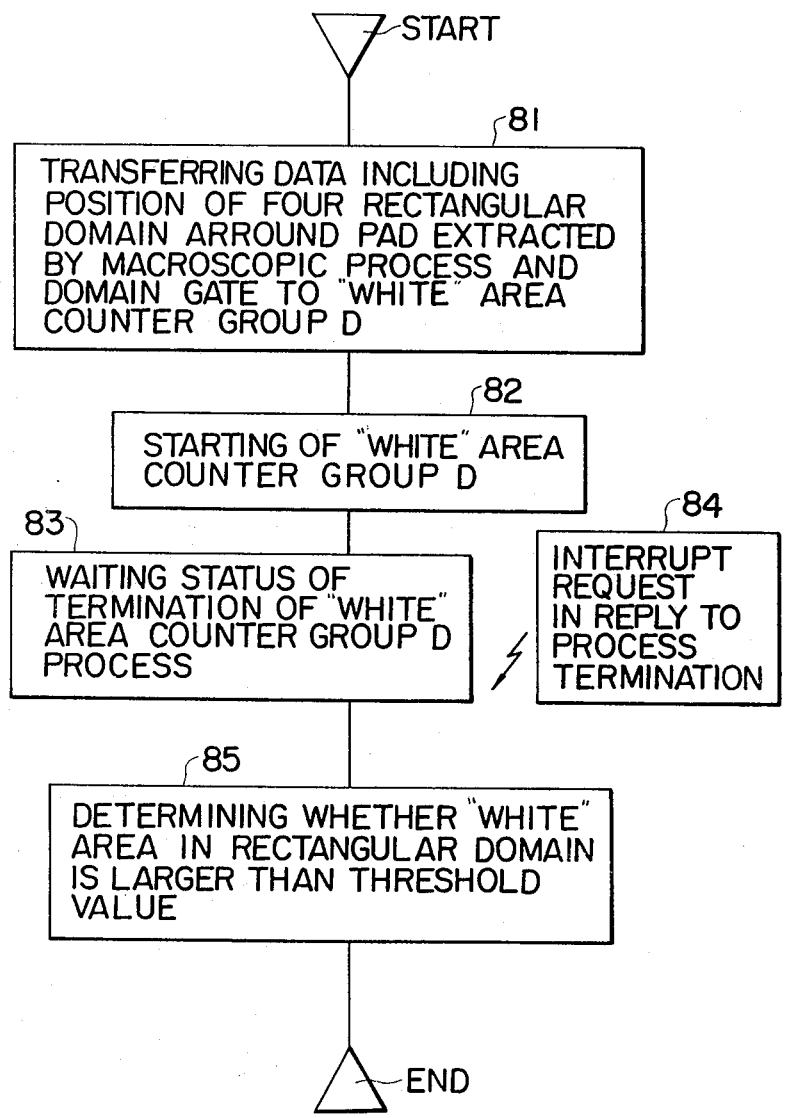
FIG. 17 is a flow chart for the direction checking process of FIG. 15.

FIG. 17 shows the way of direction checking by a white area counter group D as stated above.

More specifically, a block 81 transfers the positions of the four rectangular domains around the pad extracted through the macroscopic processing of the step (2), as well as data concerning the domain gate, to the white area counter group D which is started then by the step of the subsequent block 82. The block 83 is in the waiting or stand-by condition waiting for the termination of the processing by the group D. As an interrupt request by the termination of processing is input from a block 84, so as to decide whether the white areas of the rectangular domains are larger than the threshold value, thereby to judge whether the detected pad is the one having a specific orientation and a specific profile.

Figure 18:
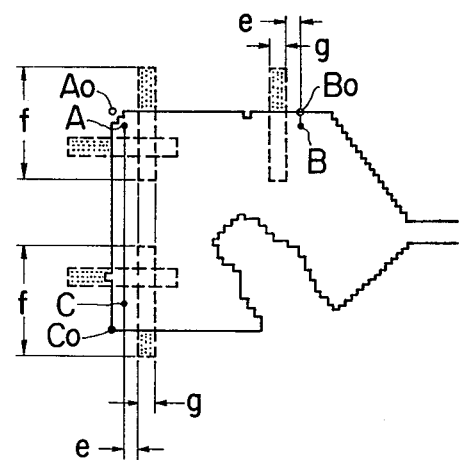
FIG. 18 is an illustration showing the principle of a microscopic process.

Referring now to the microscopic processing of the aforementioned step (4) as shown in FIG. 18, a mode 1 sampling is made as illustrated. Close to but spaced from the characteristic points A, B and C by a distance corresponding to e sampling picture elements, supposed are rectangular domains having lengths of the longer and the shorter sides of f and g picture elements, respectively. The white area, i.e. the numbers of the white picture elemets in respective domains are counted.

The number of the rectangular domains are, for the corners such as points A and C, selected to be two (these should form a right angle with each other), while for the point B located near a side edge, one.

The length of f must be maintained, so as to ensure that the conversion of patterns between the white and the black necessarily appear in the lengthwise direction of the domains.

The white areas in respective rectangular domains assume values which depend on the positions of the characteristic points obtained by the preceding macroscopic processing.

In other words, the positions of the points A, B and C can be corrected, through simple calculations, to $A_o$, $B_o$ and $C_o$, respectively, from the above obtained white areas in the rectangular domains.

Similarly to the direction checking of the step (3) stated before, the above explained microscopic processing can be performed by means of a white area counter group M which will be detailed later, although different positions and sizes of the domains may be required for those processings. In the macroscopic processing of the step (2), a point is extracted as a pad when coincidences are obtained in three of four templates. The rectangular domains in the microscopic processing are given for respective one of the characteristic points A, B anc C extracted by the coincidence or matching.

The white area counter group M unitarily includes, for example, four white area counters, and may be the same one as the counter group D mentioned before, or may be prepared separately.

When the separate groups D and M are prepared, the processing time is much reduced through a concurrent processing, although the size of the whole system becomes large, while, to the contrary, the size of the system becomes compact, but the processing time is prolonged, when one group of counters is used for the double functions of the groups D and M.

In the described embodiment, the white area counter groups D and M are provided separately and individually, for obtaining a higher speed of processing.

Figure 19:
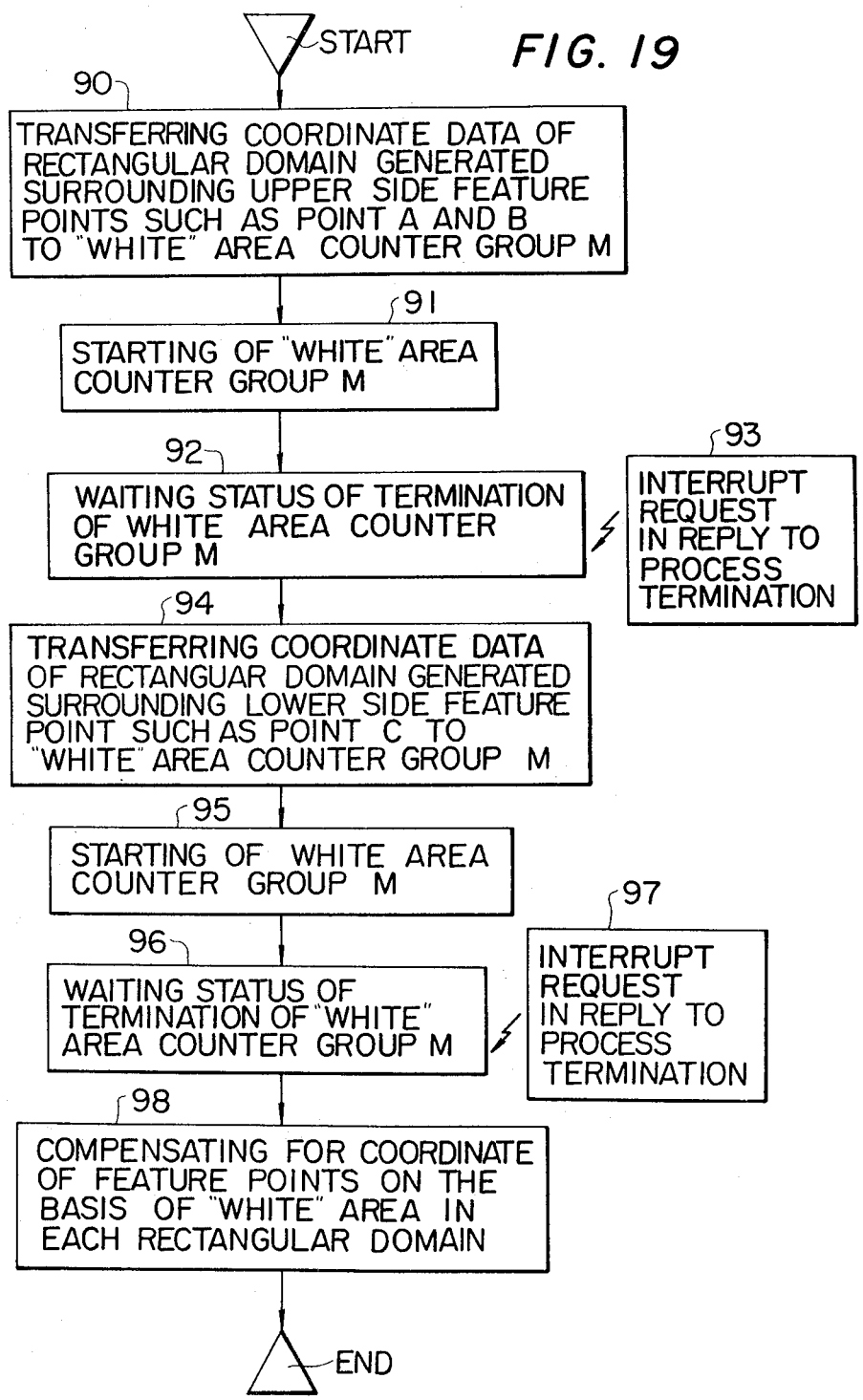
FIG. 19 is a flow chart for the microscopic process of FIG. 18.

Referring to FIG. 19 showing the way of operation of the computer software for the microscopic processing, coordinate data of rectangular domains appearing around the characteristic points appearing at the upper side of the objective pattern representative of the pad (e.g. points A and B), among the characteristic points extracted through the macroscopic processing, are transferred by a block 90 to the white area counter group M. The counter group M is then started by a block 91. Block 92 is a stand-by condition waiting for the termination of the processing by the counter group M.

As an interrupt request by the termination is provided at a block 93, the subsequent block 94 transfers the data of the rectangular domain which appears around the characteristic point C at the lower side of the objective pattern, among the characteristic points, to the white area counter group M. The counter group M is started attain by the block 95, and the step is advanced to the stand-by condition of block 96 waiting for the termination of the processing by the white area counter group M.

As an interrupt request by the termination becomes available at a block 97, the correction of the characteristic points are made from the white areas of respective rectangular domains, as at a block 98.

The processings of the blocks 92 and 96 commonly use the white area counter group M. This is allowed because a considerable time is required for the scanning to be shifted from the upper characteristic points to the lower one. Thus, the white area counter M is efficiently used to complete the microscopic processing within the same field.

Figure 20:
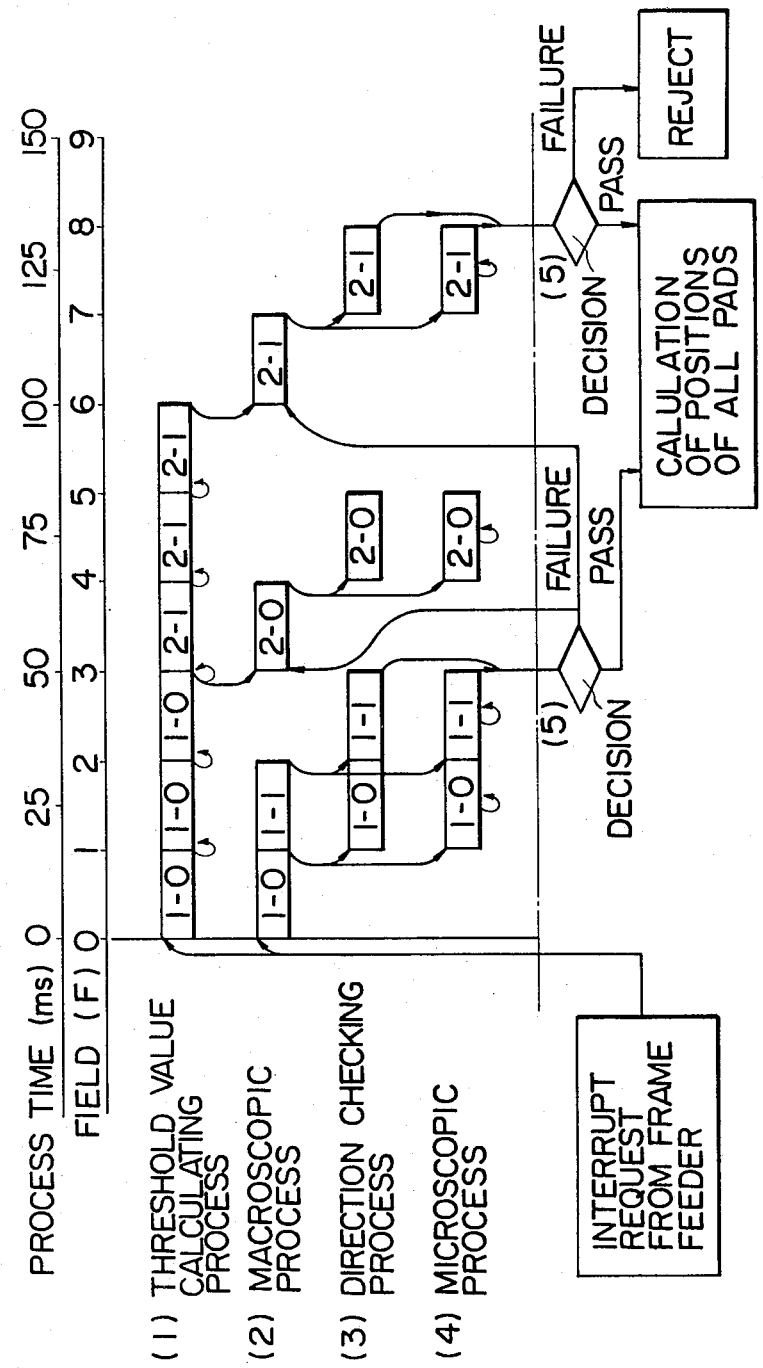
FIG. 20 is an illustration showing an example of a multiple operation of the system in accordance with the invention.

FIG. 20 shows an example of the multiple processing of the aforementioned steps (1) to (4), employing one detecting station, two TV cameras, one threshold calculation circuit, one group pattern matching circuit and two white area counter groups. In this Figure, j-ip (e.g. 1-0 or 2-1) represents that the number of the trial of the detecting operation is j and that the number of the TV camera (=0, 1) is ip, while the arrow represents the starting of processing by interrupt request by the termination of the preceding step.

At the same time, the arrow between the fields for binary processing denotes the repeated threshold calculation, and represents that 3 fields are required for determining the threshold values respectively from the analogue video signals obtained through respective cameras.

The arrow in the microscopic processing of the step (4) represents a restart of the white area counter group.

As an interrupt request by the termination becomes available from the frame feeder of FIG. 3, the threshold calculation circuit repeats the calculation of the threshold value for the video signal from the TV camera who bears the number 0, between 0 to 2 fields, simultaneously, the group pattern matching circuit performs the macroscopic processing of the video signals from the TV cameras bearing numbers 1, 0, employing the former threshold value obtained in the preceding processing.

Afterwards the microscopic checking are concurrently performed by the white area counter group D and M.

After the termination of the threshold calculation for the signal from the TV camera bearing the number 0, the macroscopic and direction checking processings are performed again using the result of this calculation, if necessary.

Thereafter, threshold calculation for the signal form the TV camera bearing the number 1 is repeatedly performed between the 3 and 5 fields, and, after that, the macroscopic processing and the direction checking processing, as well as the microscopic processing, are performed as required.

In the series of processing as explained above, the macroscopic processing is started from the beginning for the following reasons.

(i) Since the fluctuation of the reflecting rate is not so large, in case of an LSI chip, so that the threshold value for obtaining the binary signal does not exhibits a drastic change practically.

(ii) Therefore, the possibility that the threshold value used for the preceding chip is used also for the chip now examined is considerably high.

(iii) Moreover, since 6 fields are necessary in total for processing for obtaining the binary signal, time is inconveniently wasted during the determination of the new threshold value for the chip now examined.

However, the processing of the step (1) for obtaining the binary signal is intended for providing a threshold value which follows a relatively slow change caused by a drift of the gain of video signal or the level of the DC current, so that the processing of the step (1) to be started.

Therefore, the processing system preferably has a thresholding circuit independent from the threshold calculation circuit in the computer hardware, so as to obtain a threshold value of the thresholding circuit, independently from the threshold value provided by the threshold calculation circuit.

Since the macroscopic processing provides an approximate positional informations concerning the pad, which are sufficient to allow the direction checking and the microscopic processing to form their necessary rectangular templates or domains, both of these processings of steps (3) and (4) can be started concurrently soon after the termination of the macroscopic processing of the step (2).

By the arrangement as stated above, the acceptance by the deciding step (5), i.e. a two-views rationality checking (this is to check whether the positional or rotational relationship between the pads in two visual fields satisfy the previously given requirements.), ensures the detection of the pad by the former threshold value. However, since the calculation of threshold value is terminated only for the TV camera 0, the operation is suspended until the threshold calculation for the TV camera 1 is terminated.

To the contrary, when it was found unacceptable by the two-views rationality checking, the macroscopic, direction checking and the microscopic processings are started at the time when the new threshold value becomes available.

Thus, the detection of the position of the pad can be performed within 6 fields (100 ms), when judged acceptable by the first decision, and within 8 fields (133 ms) when accepted by the second decision.

For a further shortening of the processing time, the number of each processing circuit is increased, for simultaneous processings for the video signals from two TV cameras 0, 1.

However, the above processing time does not matter practically, in the system having four detecting stations as shown in FIG. 4, since it is short enough as compared with the times required for the frame feeding, writing into the cassette tape and for the wire bonding itself.

Although some of the processings have been described to be performed by a computer, they are as simple as coordinate calculation, and, therefore, a micro-computer can be used in place of computer. Even a special purpose hardware will do, if the increase of the size of the system is acceptable.

A position detecting system embodying the present invention will be fully described hereinafter.

Figure 21:
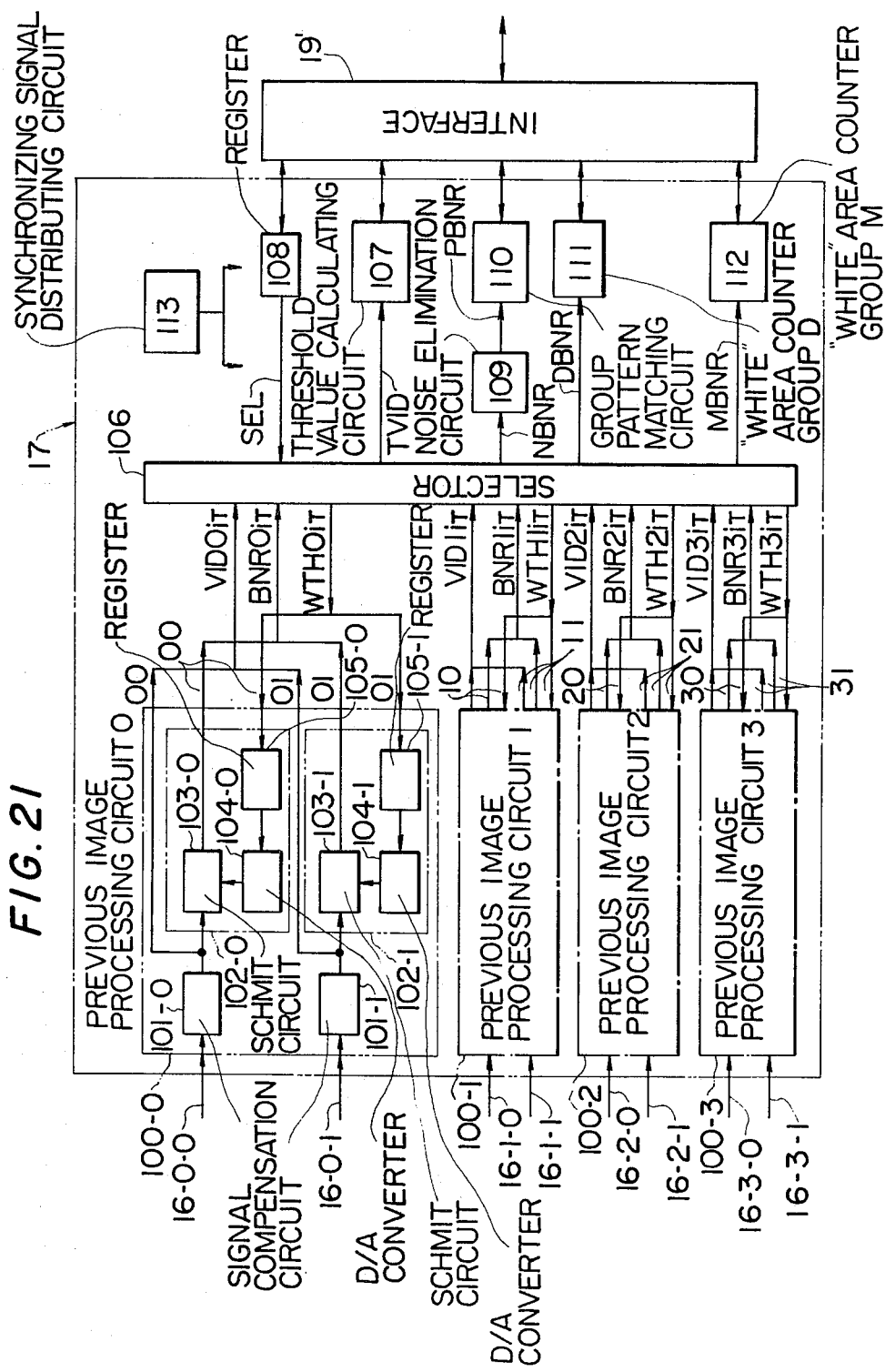
FIG. 21 shows a construction of a practical example of the position detecting system of FIG. 4.

Referring to FIG. 21, there is shown a basic construction of the position detecting system of the invention including the image processing device 17 of FIG. 4 and a part 19' of the inter face 19 related to the later 17. The illustrated system is comprised of four detecting stations of FIG. 4, one threshold calculation circuit, one group pattern matching circuit and two white area counter groups each of which consisting of four white area counters.

In this Figure, symbol 16-is-iT represents a analogue video signal obtained through the is th detecting station from the iT the TV camera. (is being 0 to 3 and iT being 0 or 1)

A previous image processing circuit 100 is adapted to perform a D.C. regeneration, compensation for deflection distorsion, and shading compensation of the analogue signal from the TV camera.

More specifically, the previous image processing circuit 100 includes a circuit 101 for D.C. regeneration of the analogue video signal, as well as compensation for the deflection distorsion and shading compensation.

These functions are performed by respective conventional methods.

A thresholding circuit 102 includes a Schmit circuit 103 having a variable threshold, a D/A converter 104 and a register 105.

The threshold value obtained through the threshold calculation of the step (2) (this threshold value is neglected from the drawings) is written in any register 105 of the previous processing circuit, by means of a conrolling signal WTHisiT, and is held by the register 105.

Therefore, a threshold value which well follows the drifting of the analogue video signal VIDisiT can be given to the Schmit circuit 103, from the output of the D/A converter 104, in accordance with the output from the register 105, through a processing as shown in FIG. 9.

Consequently, a stable vinary video signal BNRisiT results.

On the other hand, the analogue video signal VIDisiT is delivered, as illustrated in the Figure, through a selector 106, to a threshold calculation circuit 107, as a signal TVID, so as to cause a threshold calculation.

Thus, according to the invention, the image processings as explained before in connection with FIG. 20 are simultaneously performed, by means of the separate provisions of the threshold calculation circuit and the thresholding circuit.

The binary video signal BNRisiT obtained through each Schmit circuit is delivered in sequence, through the selector 106, to a noise elimination circuit 108 and to either one of the white area counter groups D,M 109,110 respectively, as signals NBNR, DMNR and MBNR.

Two kinds of binary signals such as BNRisO and BNRisl are issued from each of the previous image processing circuit 100. The selector 106 select one from these two signals, and outputs three signals of NBNR, DBNR and MBNR. No connection is made to bridge the previous image processing circuits 100. The number of image processing circuit, i.e. the number is of the detecting station is put into the selector 106.

The relationships of signals as stated above is written in the register 108, through the inter face 109', and is given to the selecter 106 as a signal SEL.

The output PBNR from the noise elimination circuit 109 is supplied to a pattern matching circuit 110, for a coarse detection of the pad.

Thus, the control of data transfer, starting and interrupt of the threshold calculation circuit 107, group pattern matching circuit 110, white area counter group D 111, and the white area counter group M 112 are made, as illustrated, through the interface 109'.

A synchronizing signal distributing circuit 113 supplies signals for the circuit 107, 109 to 112 of FIG. 21, xynchronizing signal for each TV camera, signals representative of the coordinates, and so on.

Although the binary video signal is delivered to the group pattern matching circuit 110 through the noise elimination circuit 109, the later circuit 109 can be dispensed with, if the noise is not so serious.

Since the previous image processing circuits 100 all have the same construction, only one 100-0 of them is illustrated in detail.

The example of each circuit in the previous image processing circuit when the later is connected to a mini-computer such as HITAC 10 II will be described.

The arrangement described hereinunder in general can be adopted in other computers as well.

Figure 22:
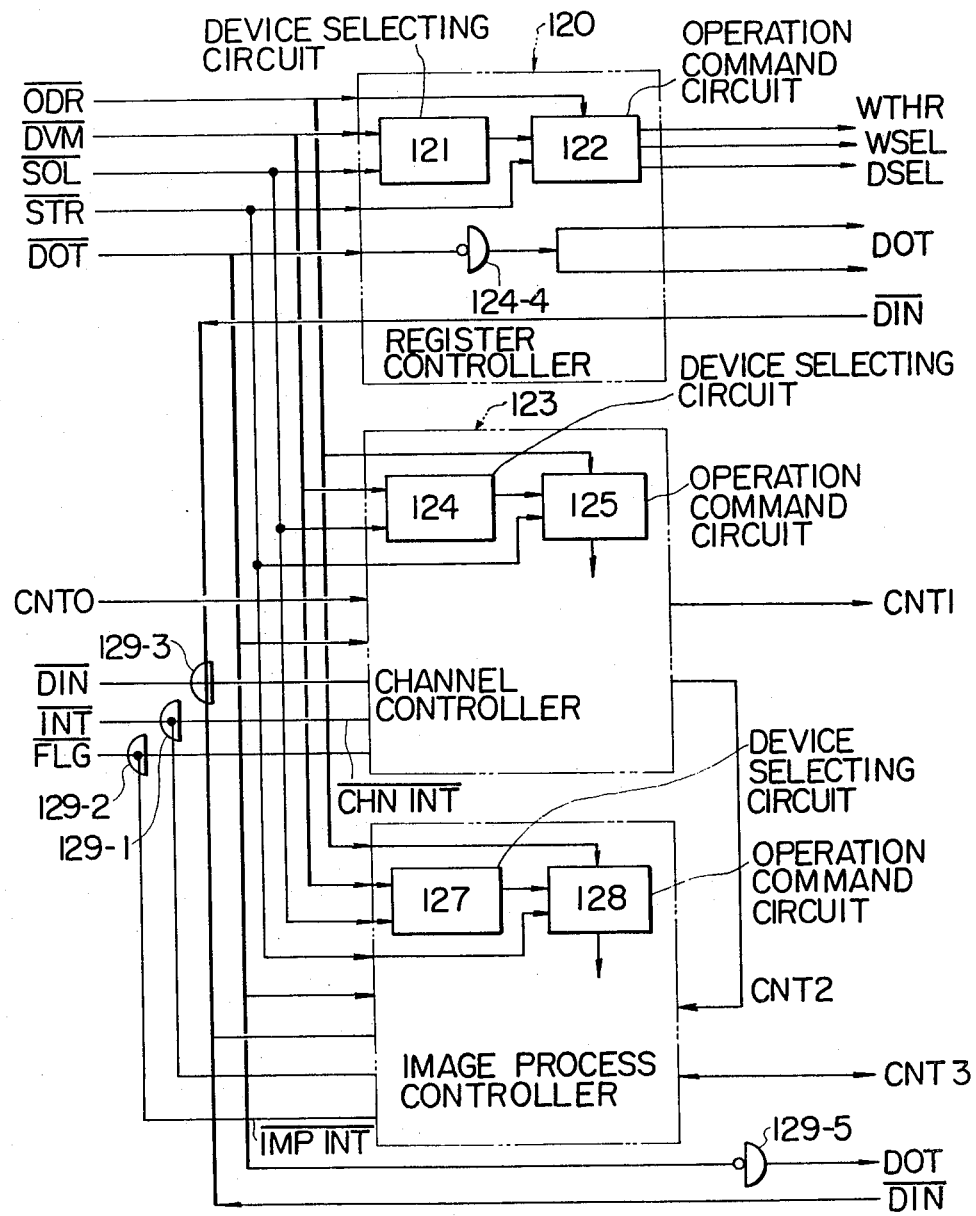
FIG. 22 shows the construction of an interface part through which the position detecting system of the invention is connected to a mini-computer HITAC 10.

FIG. 22 shows an example of the inter face 109' connected to the mini-computer HITAC 10 II. A circuit 120 so-called a register controller is adapted to perform the writing in concerning the registers 105, 108 of FIG. 21, as well as sensing of the status.

When signals DVN and SOL select the register controller 120, in a device selecting circuit 121, following three instructions are insured by an operation command circuit 122, by means of a signal ODR.

The instruction WTHR corresponds to the control signal WTHisiT for writing the threshold value in the threshold register 105 of FIG. 21, the instruction WSEL is intended for writing the signal selection relationship of the selector 106 in the register 108 for the selector, and the instruction DSEL is for sensing the status held by the register 108.

Symbol STR represents a strobe signal for executing the writing instruction.

Thus, the data are transferred as a signal DOT when the writing instruction is issued, and as a signal DIN when a sensing instruction is issued.

An explanation will be made here as to circuits 123 and 126 of FIG. 22, which are referred to as "channel controller" and "image process controller", respectively.

The function of device selecting circuits 124, 127 and the operation command circuits 125, 128 are materially same with those of the register controller 120.

The channel controller 123 is adapted to perform a high speed data transfer between the computer, and the threshold calculation circuit (1) 123, group pattern matching circuit (2) 110, white area counter group D (3) 111, and the white area counter group M (4) 112 which are shown in FIG. 21.

The image process controller 126 is intended for controlling the operation of the above four processing circuits.

The input and output signal CNTO of the channel controller 123 is the controlling signal for the high speed data transfer between the computer and the channel controller, CNTI is the controlling signal for the data transfer between the computer and the above mentioned four processing circuits, and $CNT_2$ represents a signal for the data transfer between the computer and the image processing controller 126.

The input and output signal $CNT_3$ of the image processing controller 126 is for controlling the status of operation of the four processing circuits, such as starting, operating and termination of the processing.

The output signal CHN INT is an interrupt request signal which is set at the time of termination of the data transfer, while the output signal IMP INT of the image processing controller 126, which is also an interrupt request signal, is adapted to be set when one of the processing of the above mentioned four processing circuit is terminated.

Both interrupt request signals are sent to an OR gate 129-1, as illustrated, for OR processing, and inform the computer of the interrupt request as a signal INT. Upon receipt of this request, the computer issues an instruction to sense the source for interrupt, for recognizing from what device the request is issued, through a signal FLG having passed an OR gate 129-2.

Numeral 129-3 denotes an OR gate for the signal DIN, while 129-4 and 129-5 designate NOT gates for the signal DOT.

Figure 23:
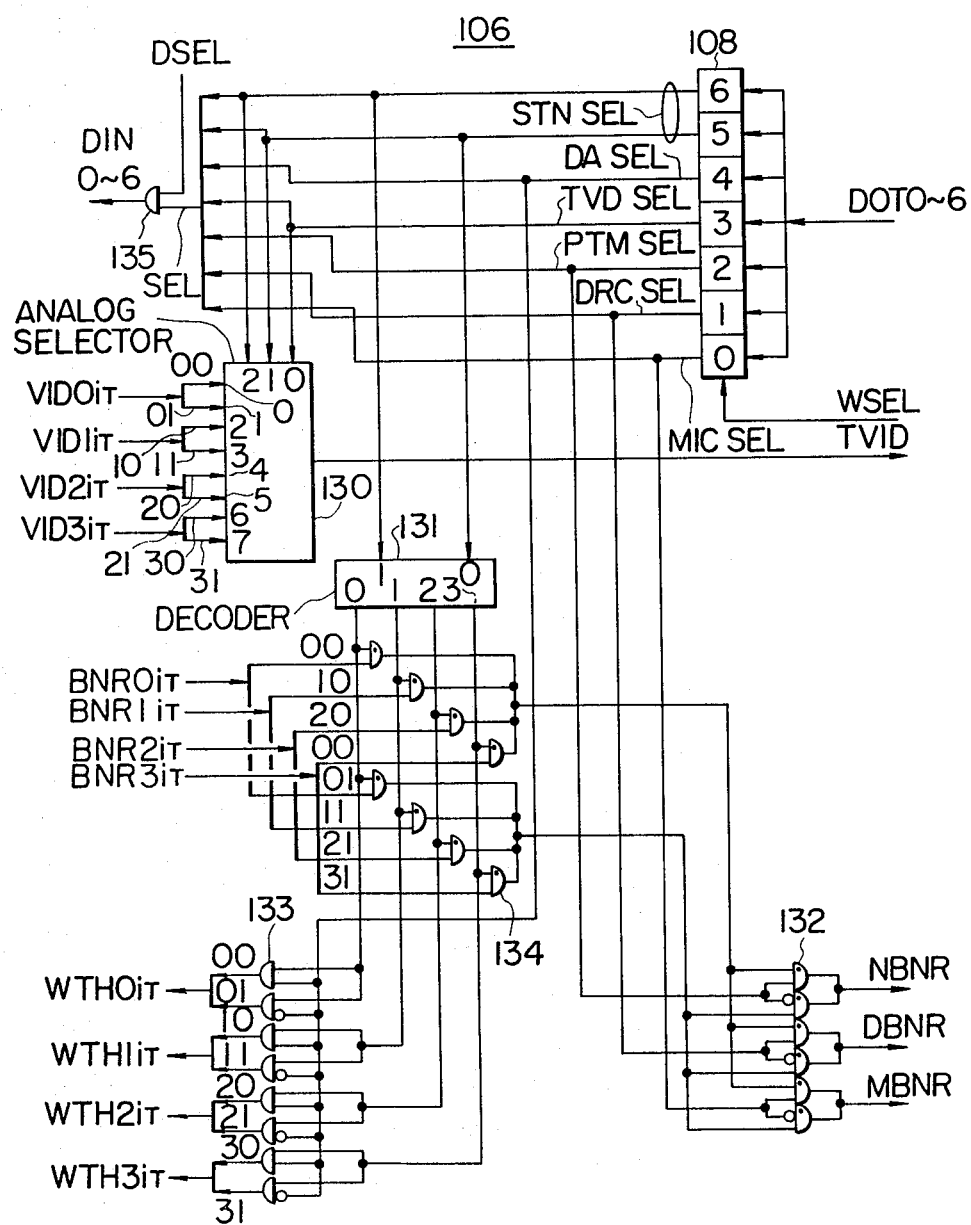
FIG. 23 shows constructions of examples of a register and selector in the system of FIG. 21.

Referring now to FIG. 23 showing examples of the register 108 and the selector 106 of FIG. 21, the register 108 is a D type latch register having 7 bits.

The 5th and 5th bits of the register 108 bear the binary numbers of the detecting stations (00)2 to (11)2, 4th bit bears binary circuit numbers (1)2, (1)2 and the 3rd bit bears the number of the analogue video signal (0)2, (1)2 which is to be input to the threshold calculation circuit 107.

The 2nd, 1st and the 0th bit bear, respectively, the number of the binary video signals to be input to the group pattern matching circuit, the white area counter group D and the white area counter group M.

The data to be written in is input as signals DOTO to DOT6, and the writing scrobe to the register 108 and the sensing or reading strobe therefrom are performed by instructions WSEL and DSEL, respectively. (See FIG. 22).

The analogue video signal VIDisiT is delivered to an analogue selector 130, where signals SIN SEL and TVD SEL from the register 108 select the numbers of is and iT, so as to change the VIDisiT signal to a signal TVID which is to be delivered to the threshold calculation circuit 107 of FIG. 21.

A decoder 131 and a group of AND gates 134 select one from the binary signals BNRisiT, which corresponds to the detecting station number is designated by the signal STN SEL.

Signals PTM SEL, DRC SEL and MIC SEL select, at an AND gate group 132, binary signals NBNR, DBNR and MBNR for the noise elimination circuit 109, white area counter group D 111 and white area counter group M 112 of FIG. 21.

Another AND gate group 133 outputs, in accordance with the output from the decoder 131 and signal PA SEL, a controlling signal WITisiT, so as to perform a writing of a threshold value in a register 105 of a corresponding thresholding circuit 102. In addition, the status of the register 108 is sensed by signal DSEL, and is delivered through an AND gate 135, as signals DIN0 to DIN6, so as to check the status of memory of the register 108.

According to the arrangement as above, various image processings as stated before are simultaneously performed, only by giving suitable numbers by the computer to the register 108.

Figure 24:
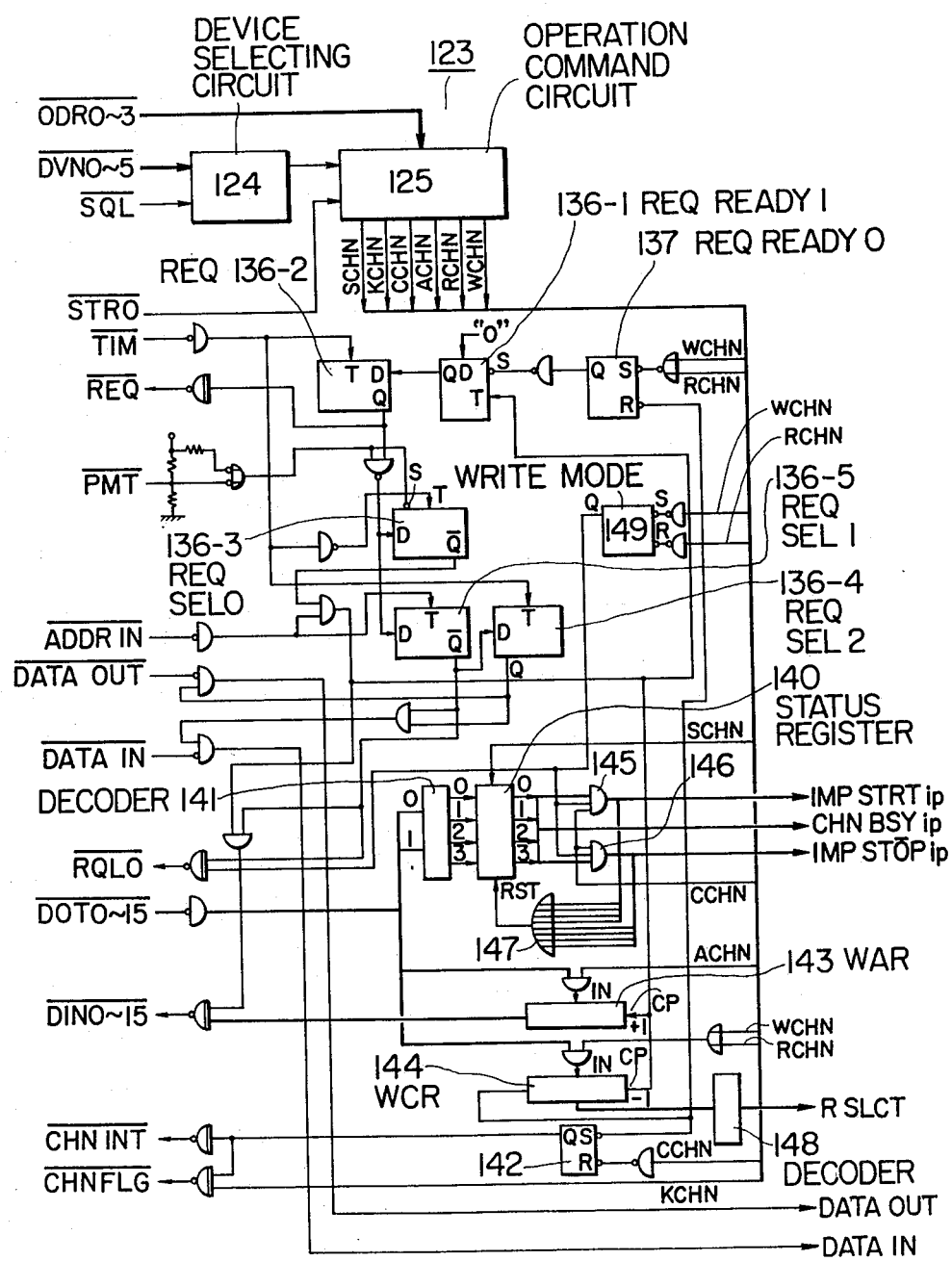
FIG. 24 shows a construction of an example of a channel controller in the construction of FIG. 22.

FIG. 24 shows the construction of a practical example of a channel controller 123 of FIG. 22.

The major parts of this controller has a construction almost same with that of the standard part of high speed inter face for direct mode of HITAC 10 II so that only portions different from those of that standard part will be described here.

Thus, the difference in construction between the channel controller 123 and the standard part resides in that input/output buffers are provided at processing circuits side, and that a channel status register 140 for representing with what circuit the computer is now performing the data transfer.

More practically, the bit for the number ip (0 to 3) corresponding to the processing circuit with which the data transfer is to be made is designated by instruction SCHN, in accordance with the content of a decoder 141. The decoder 141 performs the decoding of signals DOT0 to DOT1.

Instructions KCHN, CCHN, ACHN, RCHN and WCHN are for sensing of an intrusion flag 142, clearing of the intrusion flag 142, setting of a word address register (WAR) 143, data transfer of reading and data transfer of writing, respectively.

The word number to be transferred is set in a word count register (WCR) 144, in accordance with an instruction of RCHN or WCHN. The word address register 143 and the word count register 144 are constituted by an up counter and a down counter, respectively.

The manner of operation of the channel controller 123 of FIG. 24 will be described with reference to FIG. 25. Since the manner of operation is almost same with that of a high speed inter face (direct mode) of HITAC 10 II, the detailed description is neglected.

At first, an instruction SCHN as at (a) turns the ip th bit of the channel status register 140 to ON as at (b), so that the later outputs a signal CHN BSYip so as to designate the processing circuit to which the data are to be transferred. Then an instruction ACHN at (c) sets the address in the computer in the WAR 143. The sequencial of the instructions SCHN and ACHN may be reversed.

The number of data to be transmitted to the WCR 144 is set, by an instruction WCHN, at writing mode as at (d) and by an instruction RCHN at reading mode as at (e).

Consequently, the flip-flop 149 of WRITE MODE (FIG. 24) is set at "1" and at "0", in cases of (d) and (e), respectively, as at (f) and (g).

Then, a high speed data transfer by this channel is commenced. After the m data have been transferred, an interrupt flag flip-flop 142 is set by an address strobe signal ADDR IN, to output interrupt request signal CHN INT. The computer then issues an instruction KCHN as at (j), and clears the interrupt request signal CHN INT in accordance with an instruction CCHN (1), after confirming that the request is from this channel, by means of signals CHN FLG as at (h).

In case of (d), a signal IMP STRTip is derived as at (m) from the AND gate 145 to start the processing circuit, while, in case of (e), the AND gate 146 provides a signal IMP STOP as at (n) to stop the processing circuit. The OR gate 147 resets the channel status register 140 in either case.

In FIG. 24, 136-1 to 136-5 denote D type flip-flops, 137 denotes an S-R type flip-flop, TIM a synchronizing timing signal, REQ a data service demanding signal, PMT a signal to permit the data service demand of processing circuit, ADDR IN an address information strobe signal, DATA IN a strobe signal for data transfer from processing circuit to computer, DATA OUT a strobe signal for data transfer from computer to processing circuit, and RQLO denotes a signal to designate the transfer mode.

The details of the circuits and signals are disclosed in "HITAC 10 II INTER FACE" (Published May, 1973) and, therefore, are not described here, since they do not constitute the essential part of the invention.

In the drawings, gates provided with double lines are of collector open type. Signals TIM, REQ, PMT, ADDR IN and DATA IN (input side) and DATA OUT (input side) correspond to the signal CNT0 of FIG. 22.

As illustrated, the signal R SLCT is the content of the WCR 144 decoded by the decoder 148, and is for switching the register at the time of reading.

The signal R SLCT, as well as signals DATA OUT (output side), DATA IN (output side) and CHN BSY ip correspond to the signal CNT1 of FIG. 22. The signals IMP STRTip and IMP STOPip correspond to the signal CNT2 of FIG. 22.

Figure 26:
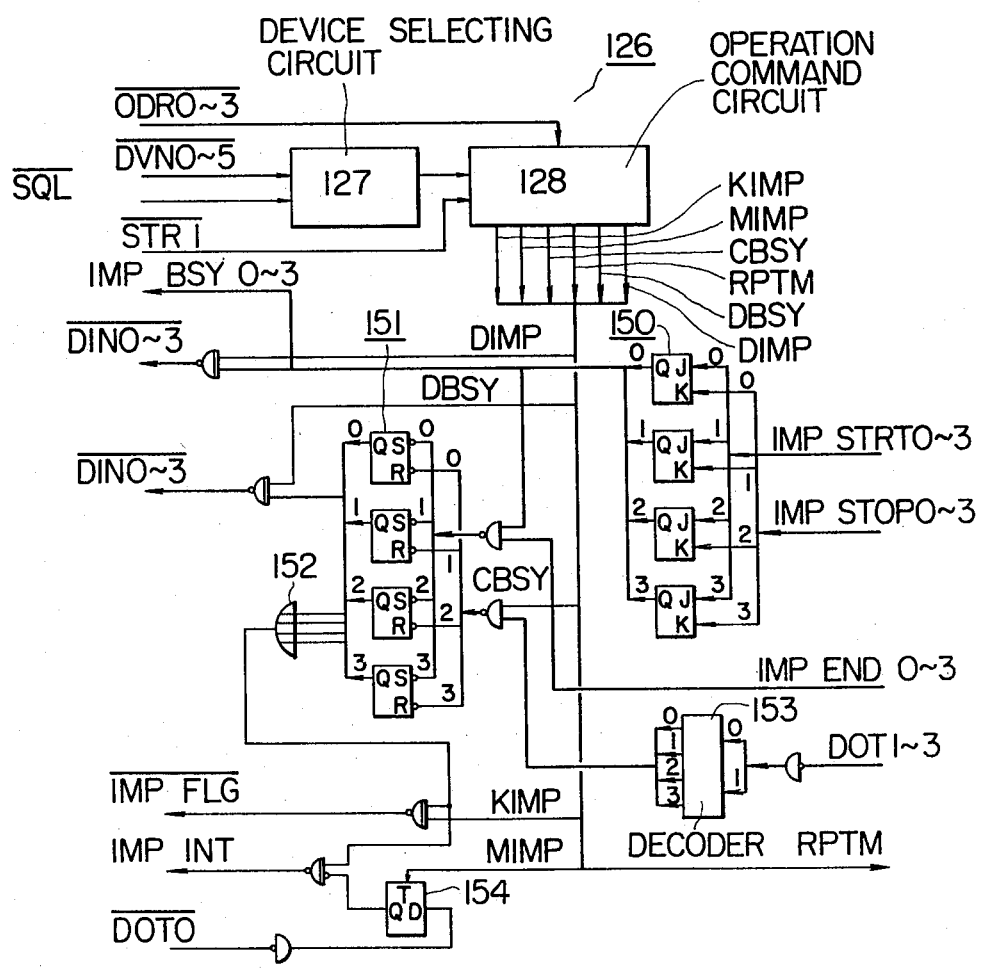
FIG. 26 is an illustration showing the construction of an image processing controller in the construction of FIG. 22.

FIG. 26 shows a construction of an example of the image processing controller 126 of FIG. 22.

The illustrated image processing status register 150 is for controlling the operations of the four processing circuits and consists of four flip-flops.

As mentioned before, signals IMP STRTip and IMP STOPip sets or resets the ip (0 to 3) th bit of the register 150 to obtain an output signal IMP BSYip to control the designated circuit.

A flag register 151 also consists of four flip-flops. When a signal IMP ENDip representative of the termination of the processing of a circuit is delivered, in a state that ip th bit of the register 150 is set i.e. when the processing circuit corresponding to the ip is operating, the ip th bit of this flag register 151 is set. Therefore, when anyone of the processing circuits terminates its operation, an interrupt request signal is output from an OR gate 152. Signal MIMP is adapted to control the set and reset of a mask register 154, so as to smoothen the operation of the computer for the interrupt request, when more than two interrupt requests are generated concurrently.

Signals KIMP, CBSY and DBSY are for sense instruction of interrupt request, for instruction clearing a specific bit of the flag register 151 and for status sense instruction for the register 151.

Signal RPTM is an instruction for controlling the reading of parameters of a group pattern matching circuit which will be described later.

Figure 27:
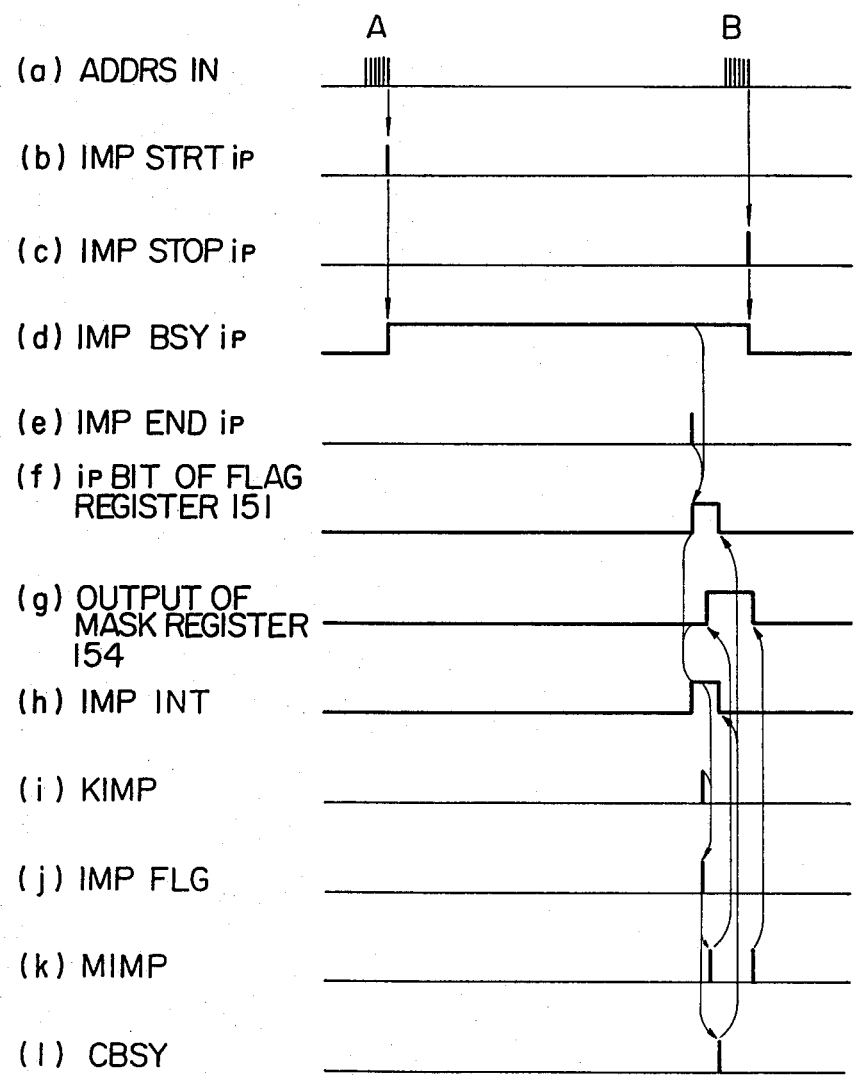
FIG. 27 shows a timing chart for explaining the operation of the image processing controller of FIG. 26.

FIG. 27 shows the manner of operation of the image processing controller of FIG. 26.

Signal RPTM is an instruction for controlling of the image processing controller of FIG. 26.

Figure 25:
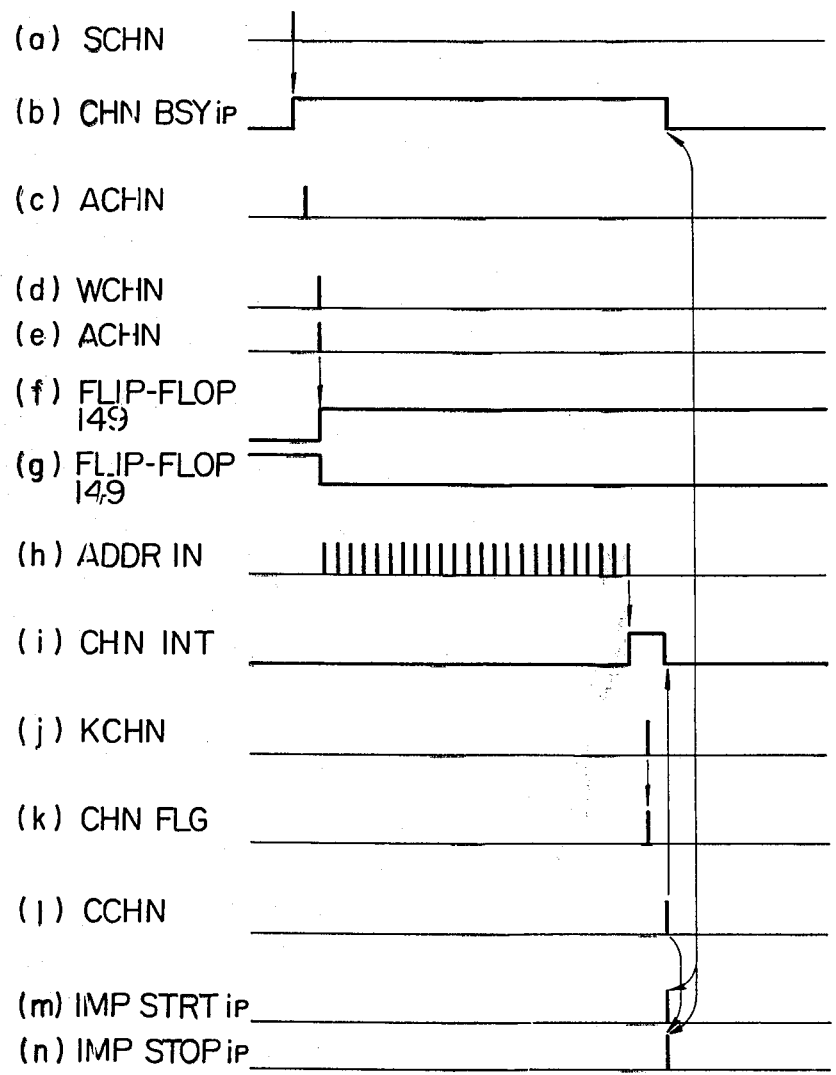
FIG. 25 shows a timing chart explanatory of the operation of the channel controller of FIG. 24.

Signals A DDR IN (A) and (B) represent, as at (a), that the data are being transferred for writing/reading by the channel controller, as shown in FIG. 25. After the writing data have been transferred by the signal ADDR IN (A), a signal IMP STRTip is issued as at (b), while, after the termination of the transfer of the read out data by the signal ADDRIN (A), a signal IMP STOPip is issued as at (c).

In accordance with the signal IMP STRTip, the ip th bit of the image status register 150 is set to produce an output signal IMP BSYip as at (d), so as to bring the corresponding processing circuit into operating condition.

After the processing circuit has terminated its task, a signal IMP ENDip is issued as at (e). If the signal IMP BSYip exists and ip th bit of the flag register 151 is set as at (f), an interrupt request signal by the termination of processing IMP INT is issued as at (h), provided that the mask register 154 is reset as at (g).

Consequently, the computer provides an instruction KIMP as at (i). The interrupt request is confirmed to be from the image input/output controller, by the returning of the signal IMP FLG as at (j).

Then, the computer provides an instruction MIMP as at (k) to set the mask register 154, and issues a signal CBSY as at (l) to clear the ip th bit of the flag register 151, which has been designated by the decoder 153, after excluding the other interrupt request.

If there is no other interrupt request, the signal IMP INT is reset. Accordingly, the computer outputs a signal ADDR IN, as at (a) so as to perform the data transfer of the data read by the channel controller.

After the termination of the transfer, a signal IMP STOPip is derived from the processing circuit corresponding to ip, so as to reset the ip th bit of the image status register 150.

Then, the computer again resets the mask register 154 by MIMP, to permit other interrupt request.

The operations of the processing circuits are controlled in the described manners. It will be seen from above explanation that the computer is allowed for a while to perform another task, after the set of the signal IMP BSYip. Thus, the processing circuits corresponding to the number other than ip may be started, so that the computer may manage a plurality of processing circuits at a time.

Figure 28:
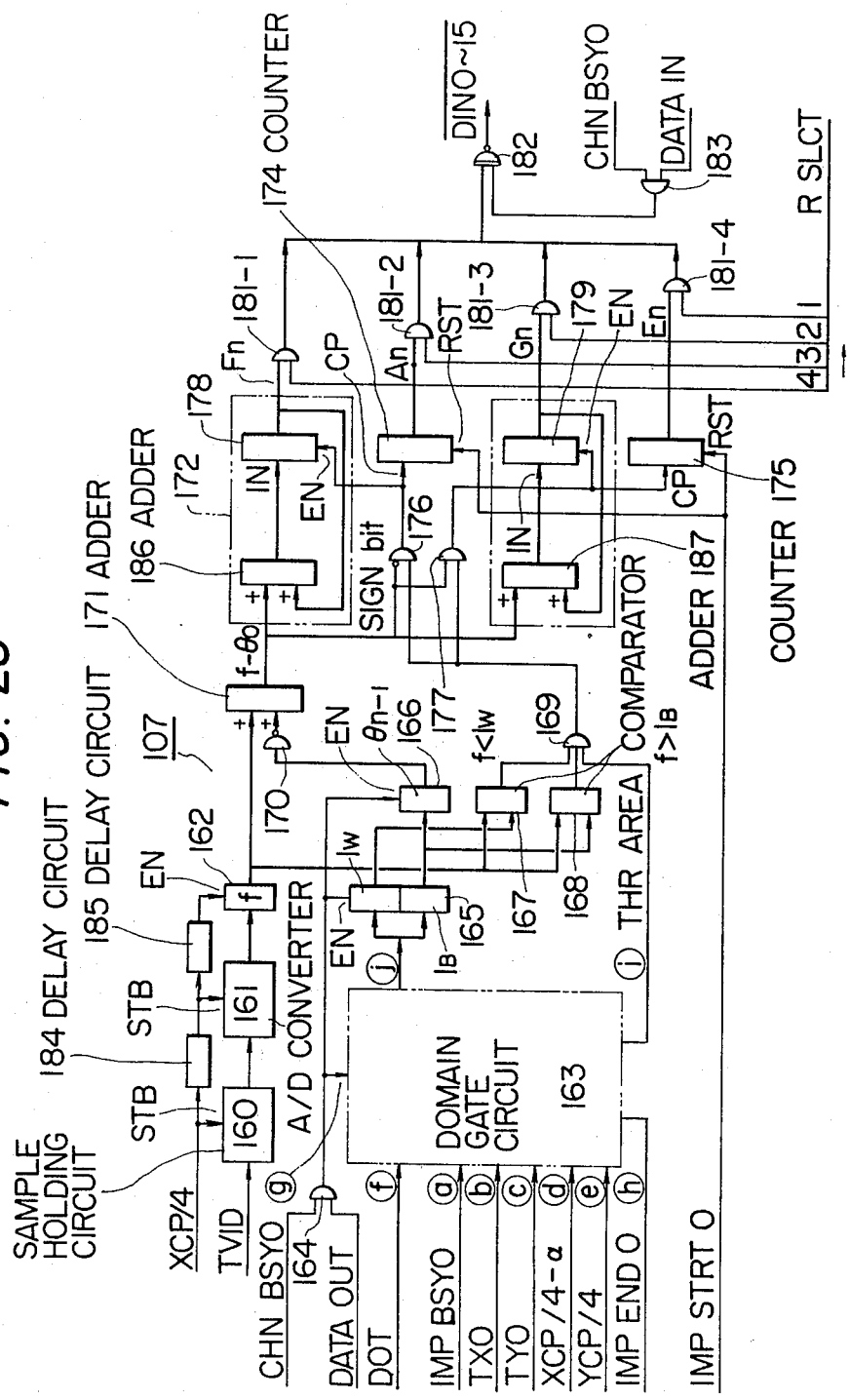
FIG. 28 shows a construction of a practical example of the threshold calculation circuit of FIG. 21.

FIG. 28 shows a construction of a practical example of the threshold calculation circuit 107 of FIG. 21.

An analogue signal TVID is converted into a digital signal by means of a sample hold circuit 160 and an A/D converter 161, and is stored in a latch register 162.

A signal XCP/4 and another signal which is a delayed one of the signal XCP/4 by a delay circuit 184 and 185 are used as clock signals for the sample hold circuit 160, A/D converter 161, and the latch register 162.

A domain gate circuit 163 is adapted to gate a specific rectangular domain, having a gate signal THR AREA at a terminal i.

The control of writing data transfer for this circuit is made by signals CHN BSYO and DATA OUT from the channel controller of FIG. 24. Through an AND gate 164, a signal is input to the terminal g of the domain gate circuit 163 and to 1 latch registers 165 and 166. Thus, by a signal DOT from a terminal f of the domain gate circuit 163, parameters for domain, boundary values $l_B$ and $l_W$ of signal levels to be neglected and initial value of threshold value $\theta_0$ are set in the domain gate circuit 163, latch register 165 and the latch register 166, respectively.

Comparators 167 and 168 are adapted to perform comparisons of the image level f in the latch register 162 with the levels $l_B$ and $l_W$, and provide outputs of "1" when f is smaller than $l_W$ and f is larger than $l_B$, respectively.

Consequently, the output from an AND gate 169 is "1", when the f falls within the range between $l_W$ and $l_B$, and, at the same time, within the designated domain.

An adder 171 having a NOT circuit 170 is adapted to provide an output of $f - \theta_0$.

Numerals 172 and 173 designate at circuits for calculating the brightnesses corresponding to the numerators of the aforementioned equations (2) and (3), i.e. brightness integrations, while numerals 174 and 175 denote circuits for performing time integration corresponding to denominators of these equations.

The arrangement is such that the AND gate 176 is opened when f is equal to or larger than $\theta_0$, to actuate the circuits 172 and 174, while, when f is smaller than $\theta_0$, the AND gate is opened to allow the operations of the circuits 173 and 175.

Referring to the construction of the brightness integration circuits 172, 173, adders 186, 187 and latch registers 178, 179 are combined in the illustrated manner, so that the input of one of the adders 186 and 187 corresponds to the $f - \theta_0$, while the input of the corresponds to the feed back signal from the latch registers 178 and 179.

As the required integration calculation for the threshold value is terminated, the domain gate circuit 163 issues through the terminal h a signal IMP ENDo representative of the termination of the calculation. Then predetermined integrated brightnesses Fn, Gn are stored in the latch registers 178 and 179, while, in the counters 174 and 175, predetermined integrated times An and Bn are stored.

IMP STRTo denotes a signal for resetting the counters 174 and 175, before they commence the integration.

The data thus obtained are successively read out by the channel controller.

More specifically, strobe pulse DATA IN for reading is delivered to an AND gate 183 for AND processing with a signal CHN BSYO, the output from which is used as a reading strobe to read the data successively, which data have been selected by the signal RSLCT and AND gates 181-1 to 181-4. The reading is made through a NAND gate 182.

The computer performs the divisions of the equations (2) and (3), on the basis of the above four parameters, to obtain a new threshold value $\theta_1$. This new threshold value is entered to the latch register 166 to become the content of the later. The threshold calculation circuit performs the similar calculations repeatedly until n becomes N, when a final threshold value $\theta_N$ is obtained.

The threshold value $\theta_N$ thus obtained is then delivered to the register 105 of FIG. 21. Consequently, binary signals are available form the Schmit circuit 103, treated with the threshold value of $\theta_N$.

To the terminals b and c of the domain gate circuit 163, delivered are timing signals TXo and TYo of the starting point of scanning, while X and Y clock signals XCP/4-$\alpha$, YCP/4 are input to terminals d and e of the domain gate circuit 163, respectively.

Figure 29:
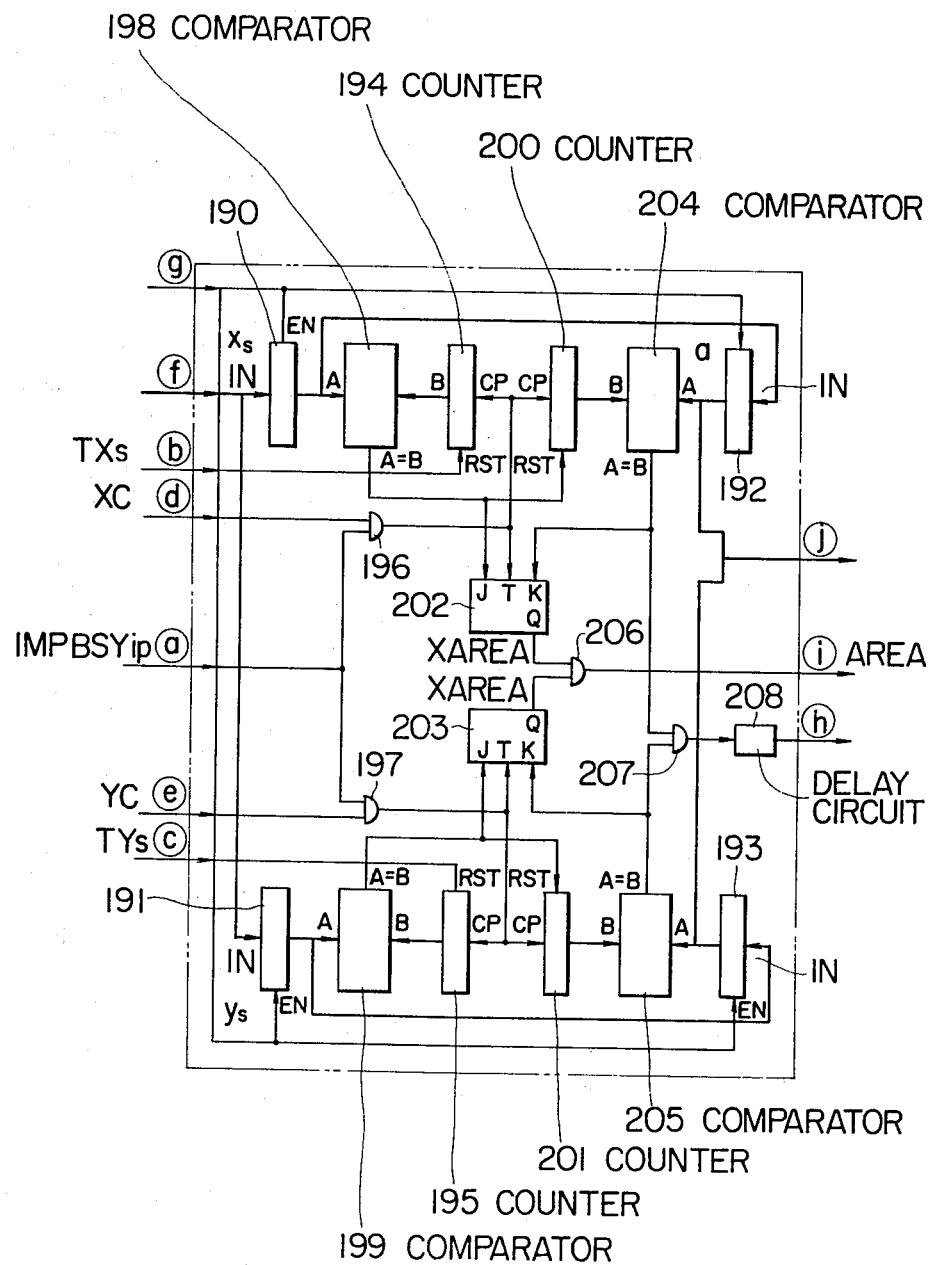
FIG. 29 shows a construction of an example of the domain gating circuit in the construction of FIG. 28.
Figure 30:
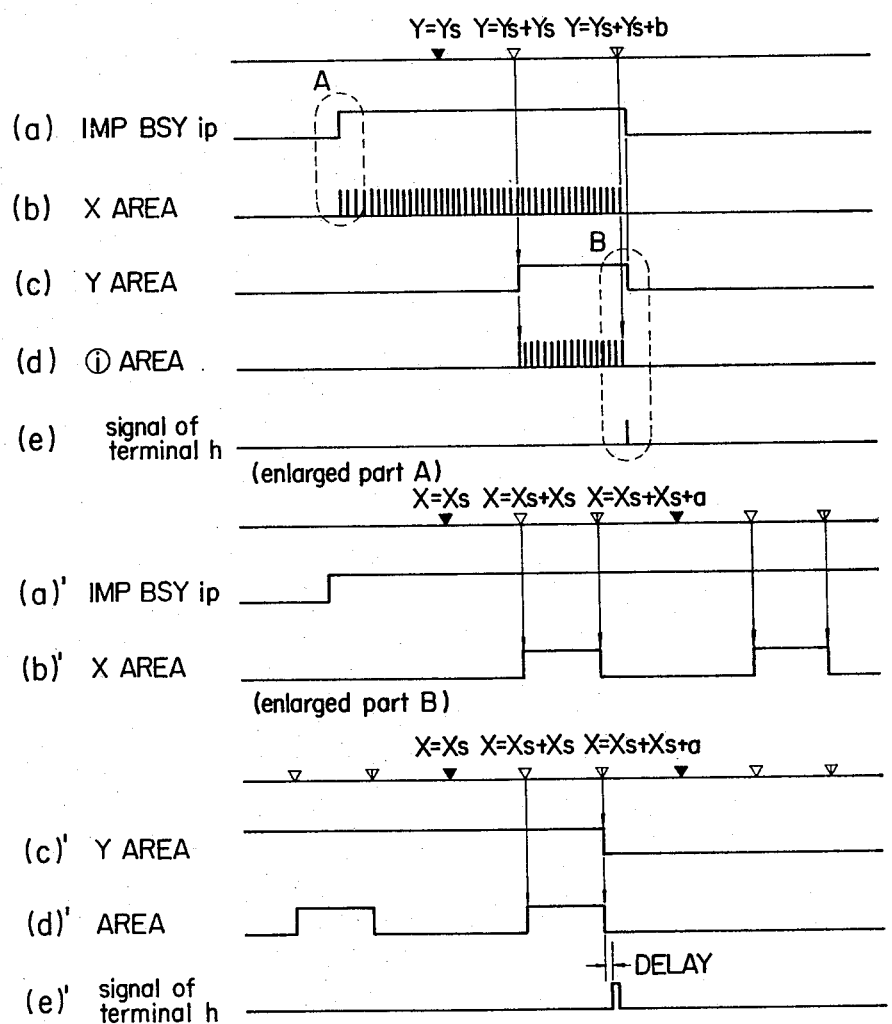
FIG. 30 shows a timing chart explaining the essential part of the construction of FIG. 29.

FIG. 29 shows a construction of a practical example of a domain gate circuit which is applicable, for example, to the circuit of FIG. 28. Parameters concerning the domain are similar to those of FIG. 16. FIG. 30 shows waveforms at essential parts of FIG. 29. In FIG. 29, latch registers 190, 191, 192 and 193 are for setting the Xs, Ys, a and b, respectively.

Thus, writing strobe provided by the channel controller is given through the terminal g. The data are input through the terminal f in series as illustrated or in parallel and are set in the latch registers 190 to 193.

The terminals b and c are for initializing the counters 194 and 195. At an instant in which scanning position X and Y come to Xs and Ys of FIG. 16, signals TXs and TYs are provided to reset the counters 194 and 195.

As illustrated in FIG. 30, the signal IMP BSYip from the terminal a is turned ON, when the corresponding processing circuit becomes operative. The X clock XC and Y clock YC from the terminals d and e are allowed to pass respective AND gates 196 and 197, so as to allow the counters 194 and 195 to commence the counting.

Consequently, pulses are given to comparators 198 and 199, at timings X=Xs+xs and Y=Ys+ys, respectively.

Accordingly, counters 200 and 201 are reset, and flip-flops 202 and 203 are set.

The counters 200 and 201 commence the counting, and output pulses are delivered from comparators 204 and 205 at timings of Xs+xs+a and Ys+ys+b, respectively, so as to reset the flip-flops 202 and 203 respectively. Consequently, a signal XAREA (FIG. 30b) is available at the flip-flop 202, which signal is ON within the region of time of Xs+xs≦X≦Xs+xs+a, while, from the flip-flop 203 a signal YAREA (FIG. 30c) is obtained, which signal is ON within the region of time of Ys+ys≦Y≦Ys+ys+b.

From output of AND gate 206, i.e. from terminal i thereof, a signal AREA which is ON within the region of time of Xs+xs≦X≦Xs+xs+a and Ys+ys≦Y≦Ys+ys+b, as shown in FIG. 30d.

Since the output from AND gate 207 provides pulses, as shown at section B of FIG. 30(a) at timing of X=Xs+xs+a and, at the same time, Y=Ys+ys+b, a pulse is output from the terminal h, by the delay circuit 208, representative of the termination of the scanning, as shown in FIG. 30(e).

Terminal j is an output terminal for use in case that the writing data by the channel controller has something to do with the subsequent circuit.

FIGS. 30(a)', (b)', (c)', (d)' and 30(e)' are enlarged representations of FIGS. 30(a), (b), (c), (d) and 30(e), respectively.

When the circuit of FIG. 29 is adopted as the domain gate circuit 163 of FIG. 28, timing signals TXo, TYo are input to terminals b and c, clock signals XCP/4-α, YCP/4 are to terminals d and c, and the output from the AND circuit 164 is applied to the terminal g, while its output from the terminal j is applied to the latch register 165, and the output from the terminal h is delivered to the image processing controller as the signal IMP ENDO.

Figure 31:
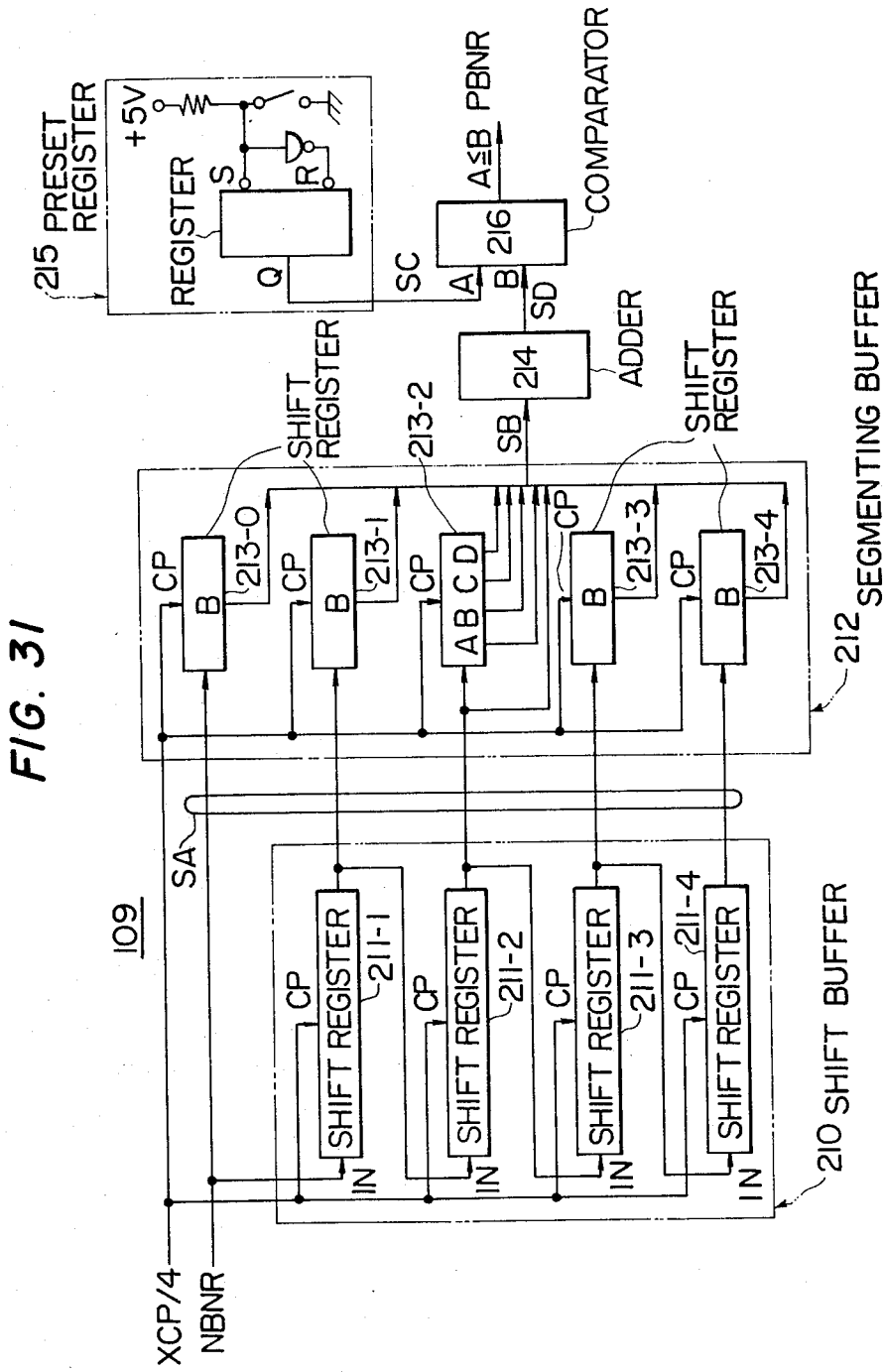
FIG. 31 shows a construction of an example of the noise elimination circuit of FIG. 21.

FIG. 31 shows an example of the noise elimination circuit as shown in FIG. 21.

The illustrated example incorporates a crossshaped area having lengths of five sampling picture elements in X and Y directions, as mentioned with reference to FIG. 10.

A portion 210 so-called buffer is a group of shift registers of serial input-serial output type having a memory capacities corresponding to four horizontal scanning lines.

The length of the registers 211 is, in case that the sampling clock XCP/4 for sampling mode 4 is used, for example, 96 bits. On the other hand, a portion 212 called segmenting buffer is for segmenting the region of 5 sampling picture elements in X and Y directions, by means of a sampling clock of the signal XCP/4, and consists of 5 shift registers of serial input-parallel output type having a length of 4 bits.

The arrangement is such that the input signal NBNR, as well as outputs SA from respective shift registers 211-1 to 211-4 are in parallel input to respective shift registers 213-0 to 213-4.

The outputs SA are informations of the same X coordinate, and having Y coordinates sampled with, for example, mode 4.

Output SB is a signal corresponding to the cross-shaped region of FIG. 10.

An adder 214 (one bit-nine inputs) is adapted to count the number of "1" of the output SB.

A register 215 is adapted to preset the threshold value and provided an output SC which is compared with the output SD of the adder 214 by a comparator 216, whose output PBNB becomes "1" when SD is equal to or larger than SC.

The signal PBNB thus obtained is free from quantization errors of the pattern, as well as from small isolated noises.

Figure 32:
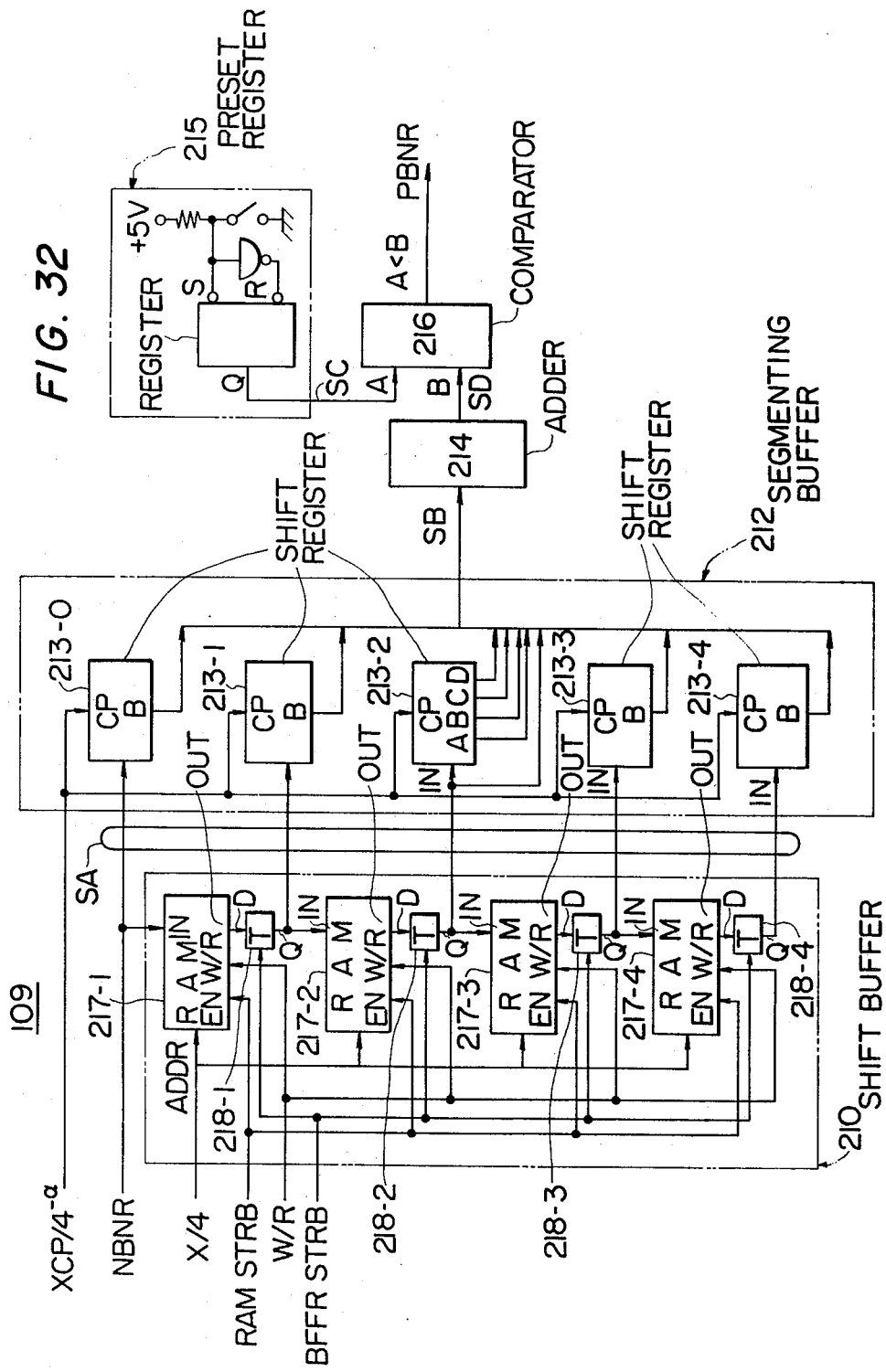
FIG. 32 shows a construction of another example of the noise elimination circuit of FIG. 21.

FIG. 32 shows a construction of another example of the noise elimination circuit 109 of FIG. 21, which differs from that of FIG. 30 in that a random access memory (RAM) 217 is used in place of the shift register 211 of the shift buffer 210, for obtaining an equivalency.

Since the shift register having just 96 bits is not commercially available, suitable registers as having, for example, 64 and 32 bits respectively, are combined to provide the 96 bits in total. However, this inconveniently increases the number of IC. In good contrast to the above, the length can be freely chosen, when the RAM is used, without increasing the number of IC.

Figure 33:
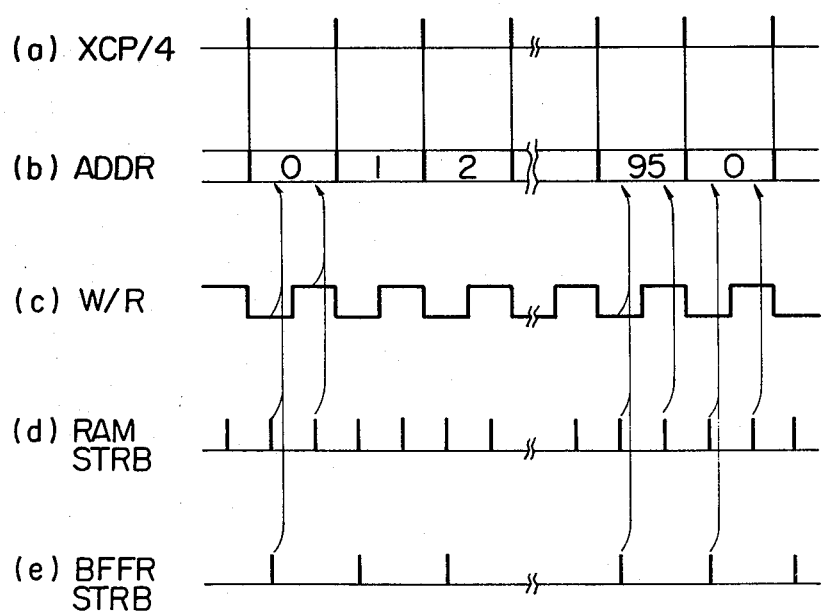
FIG. 33 shows a timing chart for explaining the operation of a random access memory (RAM) in the construction of FIG. 32.

The RAM of FIG. 32 acts in the manner shown in FIG. 33. An address signal ADDR of the RAM 217 shown at section (b) of the Figure is renewed for each clock signal XCP/4 (a), and assumes the number of 0 to 95 during one raster scanning period.

A signal W/R shown at section (c) of Figure is for ordering writing/reading of the RAM 217, more specifically, "0" and "1" are respectively for reading and writing.

Signal RAM STRB at section (d) is a strobe signal for reading/writing for the RAM 217, while BFFR STRB at section (e) represents a signal for a buffer register (D type flip-flop) 218.

As illustrated, at the earlier half of each pulse of XCP/4, informations concerning the RAM 217 corresponding to the address of the address signal ADDR are written in the buffer register 218. At the later half of the pulse, the informations read out from the buffer register 218 is delivered to the shift register 213 and is written into the same address of the RAM of next stage.

This operation is repeated for each pulse of XCP/4, so that the RAM can act as a shift register. Subsequent steps are identical to those of FIG. 31 and, therefore, not described here.

The serial input-parallel output shift registers 213 for constituting the segmenting buffer 212 of FIGS. 31 and 32 may be substituted by four latch registers having a bit component of the signal SA.

Similarly, the circuits 214, 215 and 216 may be replaced by a circuit which is adapted to convert the signal SB into current and to analogously add the current for thresholding by a Schmit circuit.

In general, for obtaining a segmenting buffer for segmenting a region of i and j sampling picture elements in X and Y directions, a shift buffer consisting of j−1 shift registers of serial input-serial output type or RAMs.

The signal PBNR free from noises is then delivered to the subsequent processing circuit, i.e. the group pattern matching circuit.

Figure 34:
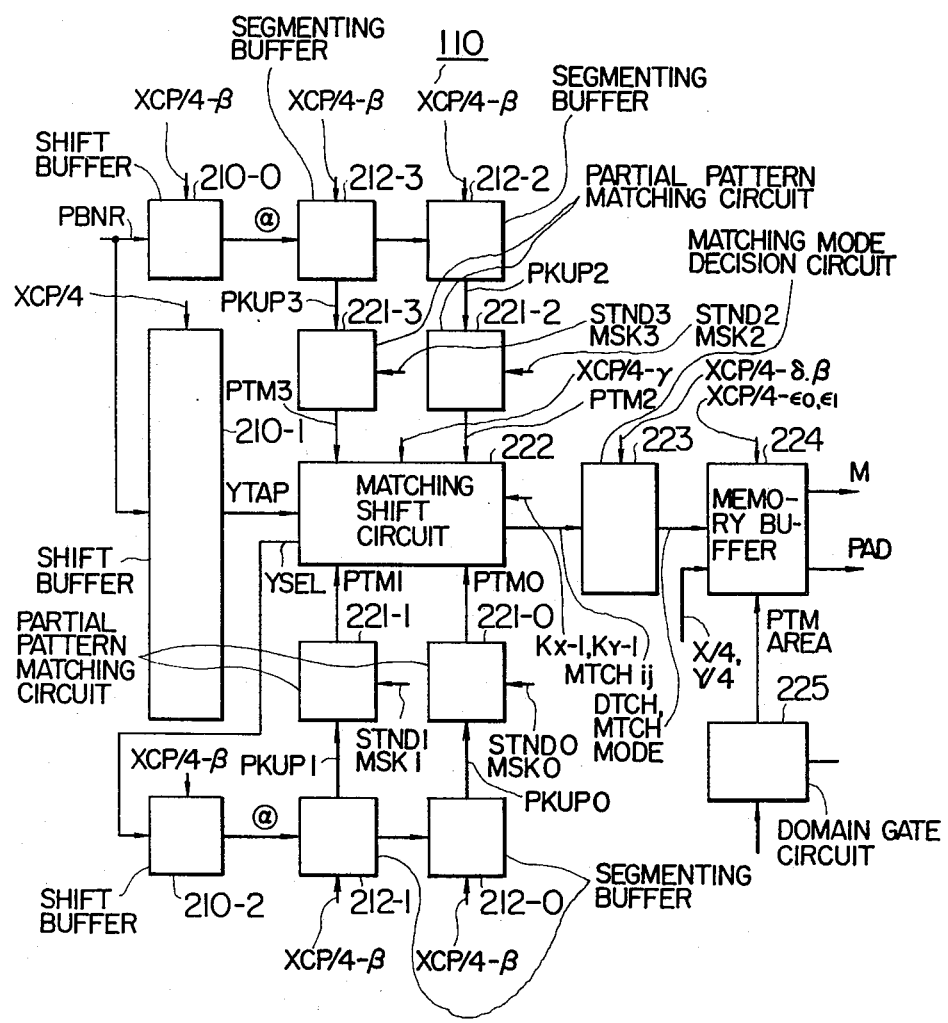
FIG. 34 shows a construction of an example of the group pattern matching circuit of the construction of FIG. 21.

FIG. 34 shows an example of the group pattern matching circuit as shown in FIG. 21.

As is the cases of FIGS. 31 and 32, shift buffers 210-0, 210-1 and 210-2 consist of, respectively, 4, 15 and 4 shift registers of serial input-serial output type or of RAMs each having 96 bits.

Also, as is the cases of FIGS. 31 and 32, segmenting buffers 212-0 to 212-3 are constituted by shift registers of serial input-parallel output type or latch registers.

Thus, the role expected on the shift buffers 210-0, 210-2 is to obtain informations SA of common X coordinate and Y coordinate connected by mode 4 sampling, as is the case of the aforementioned noise elimination circuit.

The shift buffer 210-1 is adapted to preserve clearances between standard mask patterns as shown in FIG. 12 in Y direction.

Segmenting buffers 212-0, 212-1, 212-2 and 212-3 are for providing objective patterns PKUPo, 1, 2 and 3 for respective regions of FIG. 12.

Partial pattern matching circuit 221-0, 221-1, 221-2 and 221-3 are circuits for deciding the coincidence or matching of the objective patterns DKUPo, 1, 2 and 3 with standard mask patterns STNDo, 1, 2, and 3, respectively. For this decision, the aforementioned equation (4) shall be recalled.

The outputs PTMo.1, 2, and 3 are "1" when the objective pattern matches the corresponding standard mask pattern, and "0" if not.

A matching shift circuit 222 is the circuit for judging geometrical distance between the domains, as shown in FIGS. 12 and 13. The decision in the X direction is made by relatively delaying the result of the matching PTMo.1, 2 and 3, while the decision of distance in the Y direction is performed by choosing one of the signals YTAP which are tap signals from the plurality of shift register or RAMs of the shift buffer 210-1.

Signal MTCHij represents the result of the distance decision.

A circuit 223 called matching mode decision circuit is to judge the mode of matching, i.e. the manner in which the matching is established, providing the result of the decision through output signals MTCH MODE AND DTCT.

The result of decision MTCH MODE and DTCT successively obtained as the scanning is continued, as well as coordinates X/4, Y/4 at which the matching is obtained, is temporarily stored in the memory buffer 224.

A domain gate circuit 225 is adapted for providing a signal PTM AREA which permits the extraction of the pad only from the designated template, and consists of a circuit as shown in FIG. 29.

The number of the pads M and the result of the extraction of these pads are transferred to the computer.

Although the domain gate circuit is singular in the above explained example, the gate circuit may be provided in plural, if a more complicated shape of template is to be gated.

Examples of circuits constituting the group pattern matching circuit will be described hereinafter.

Figure 35:
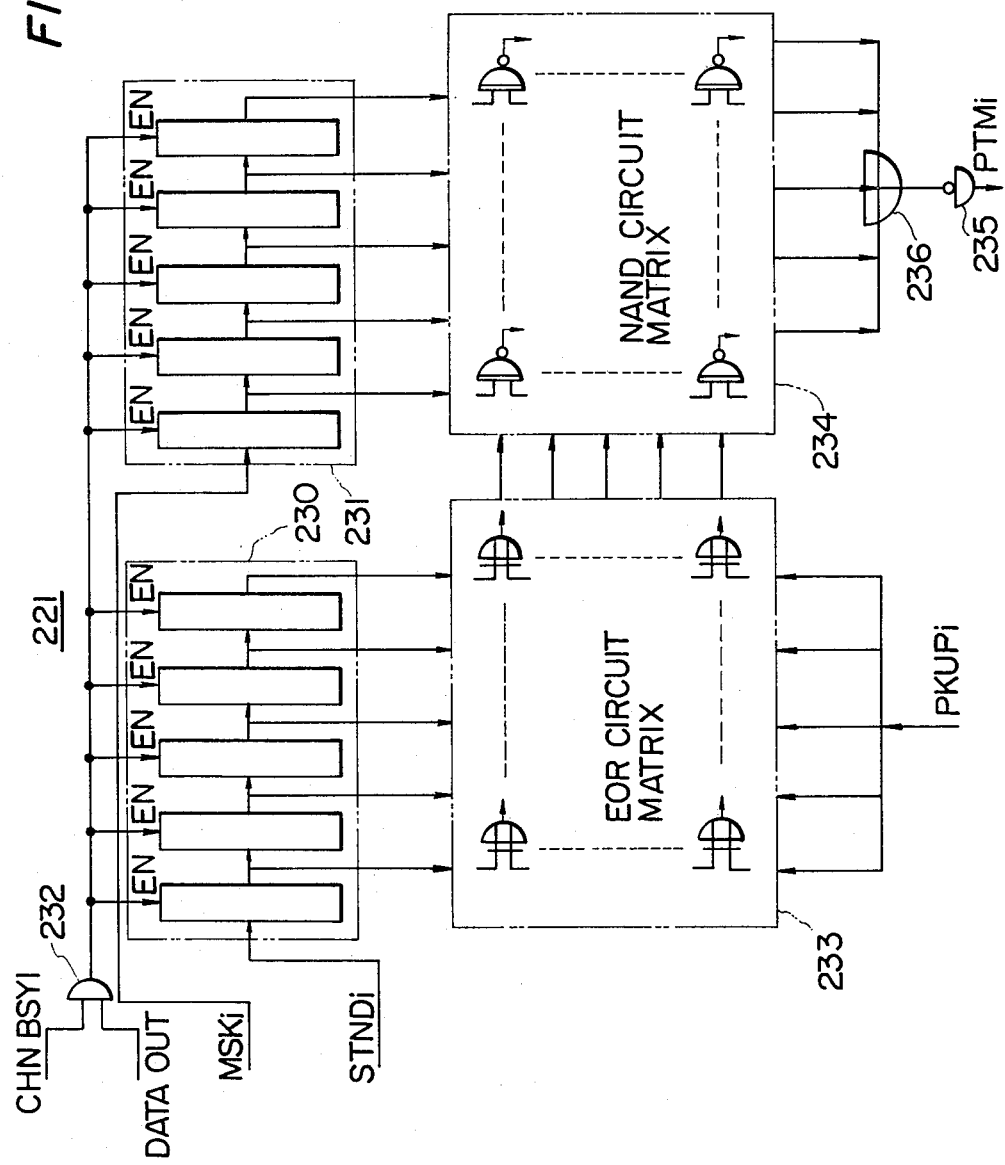
FIG. 35 shows a construction of an example of a partial pattern matching circuit of the construction of FIG. 34.

Referring to FIG. 35 showing an example of the partial pattern matching circuit 221 of FIG. 34, the partial pattern matching circuit is intended for partial pattern having 5 picture elements in X and Y directions, respectively. As illustrated, a standard pattern register 230 and a mask pattern register 231 consist of, respectively, 5 latch registers (5 bits).

The registers are arranged in tandem as illustrated. The writing of data in these registers is made through the channel controller. Namely, the signal CHN BSY1 and the writing strobe signal DATA OUT are delivered to an AND gate 232 for AND processing, so as to allow the transfer of the standard pattern signal STNDi and the mask pattern signal MSKi from left to right sides of registers in the drawing.

A two-dimensional signal PKUPi transmitted from the segmenting buffer 212 of FIG. 34 and representative of the objective pattern is delivered to a matrix 233 of exclusive OR circuit, along with the outputs from the latch registers of the register 230, so that the corresponding ones may be treated by EOR, the results of which are transferred to a subsequent NAND circuit matrix 234. As illustrated, each of the NAND circuit is in the form of an open collector. The results of EOR processing, and the results of NAND processing of mask patterns from respective latch registers of the register 331 are processed by a gate 236. A signal PTMi representative of the result of the pattern matching is then obtained through a NOT circuit 235.

Figure 36:
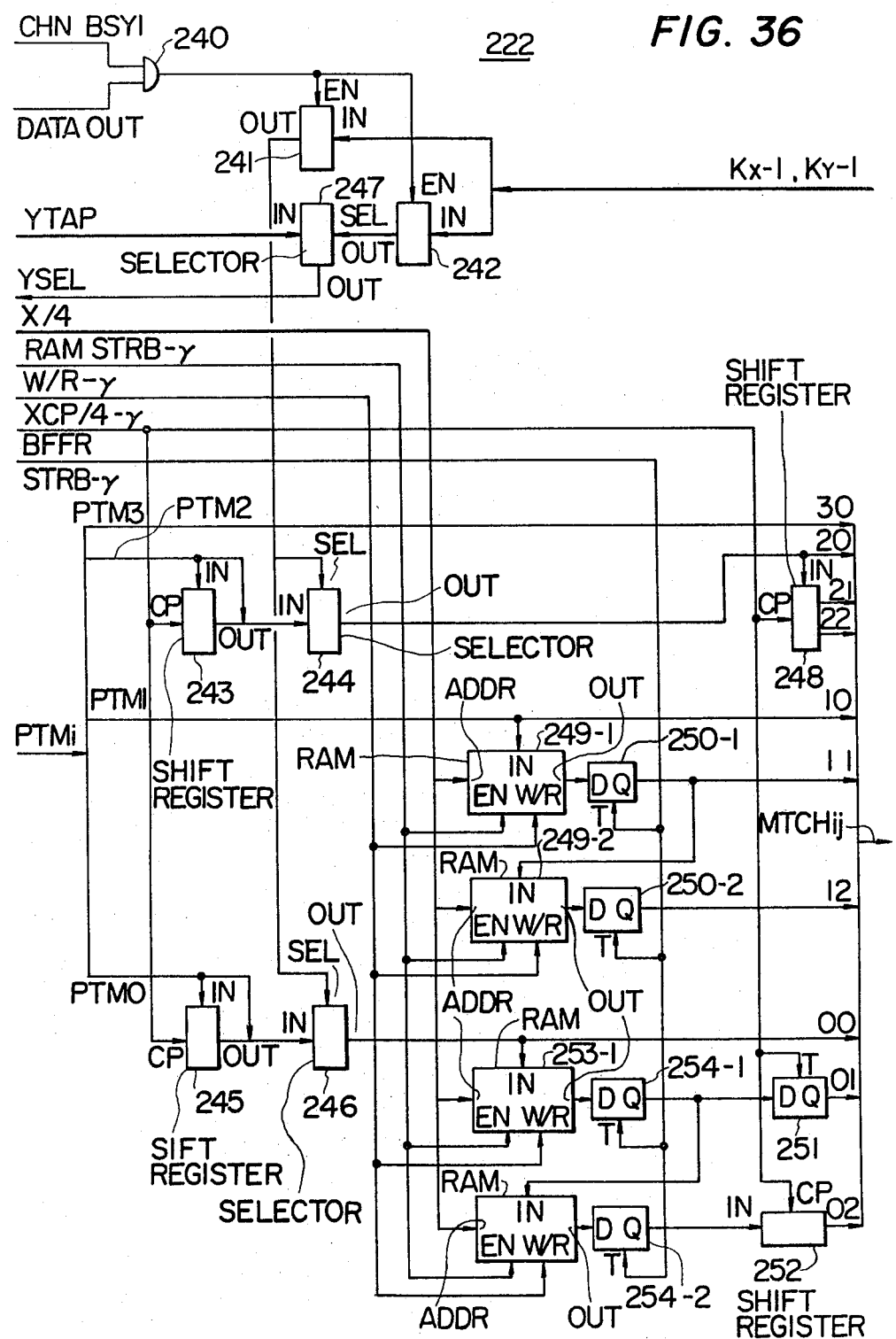
FIG. 36 shows a construction of an example of a matching shift circuit in the construction of FIG. 34.

FIG. 36 shows an example of the matching shift circuit 222 of FIG. 34. Latch registers 241 and 242 are adapted to hold the results of subtractions of 1 (one) from the distances Kx, Ky which represent the distances between domains in both X and Y directions, i.e. Kx−1 and Ky−1.

These data are written in by the channel controller. Namely, as is the case of FIG. 35, signals CHN BSY1 and DATA OUT are AND treated by an AND gate 240, so that the writing strobe signal is imparted to the latch registers 241 and 242. Since this function is the same with that of the circuit of FIG. 35, it is possible to make use of the output from the AND gate of FIG. 35 as the strobe signal for the latch registers 241 and 242.

The output from the latch register 241, i.e. Kx−1 is delivered, as illustrated, to selectors 244 and 246, so as to select one of the signals PTM2 and PTM0 delayed by shift registers 243 and 244 of serial input-parallel output type.

On the other hand, the output Ky−1 from the latch register 242 is delivered to a selector 247. Tap outputs YTAP of the shift buffer of FIG. 1 are subjected to selection and the selected one YSEL is put into the shift buffer 210-2 of FIG. 34.

The signal PTM3 representing the result of the matching are used as an output signal MTCH 30. As to the matching result signal PTM2 corresponding to the point $P_{30}$ of FIG. 13, the output from a selector 244 is delayed by a shift register 248 of 2-bits serial input-parallel output type. The output itself from the selector 244, signals behind the output by one and two picture elements are MTCH20, 21 and 22 and correspond to points P20, P21 and P22, respectively, of FIG. 13.

The signal PTM1 of the result of matching is delayed, as shown in Figure, by two raster scanning lines, by means of two RAMs 249 and also two buffer memories 250.

The signal PTM1 itself, a signal delayed by one raster scanning line and a signal delayed by two raster scanning lines are turned to signals MTCH 10, 11 and 12, corresponding respectively to the points P1o, P11 and P 12.

Concerning the matching result PTM10, similarly, by means of RAMs 253-1, 253-2, buffer memories 254-1, 254-2 and 251, and a shift register 252 of serial input-serial output type, the output from the selecter 246 itself, a signal delayed by one sampling picture element and one raster scanning line and another signal delayed by two sampling picture elements and two raster scanning lines turned to signals MTCH00, 01 and 02, corresponding to the points Poo, Po1 and Po2.

By adopting above arrangement, it becomes possible to obtain a spacious relationship in correspondence with the results of the matchings.

As is the case of the noise elimination circuit 109 of FIG. 31, a shift register can be used in place of the RAMs 249 and 253 and the buffer memories 250 and 254 in the shift buffer of this circuit.

Figure 37:
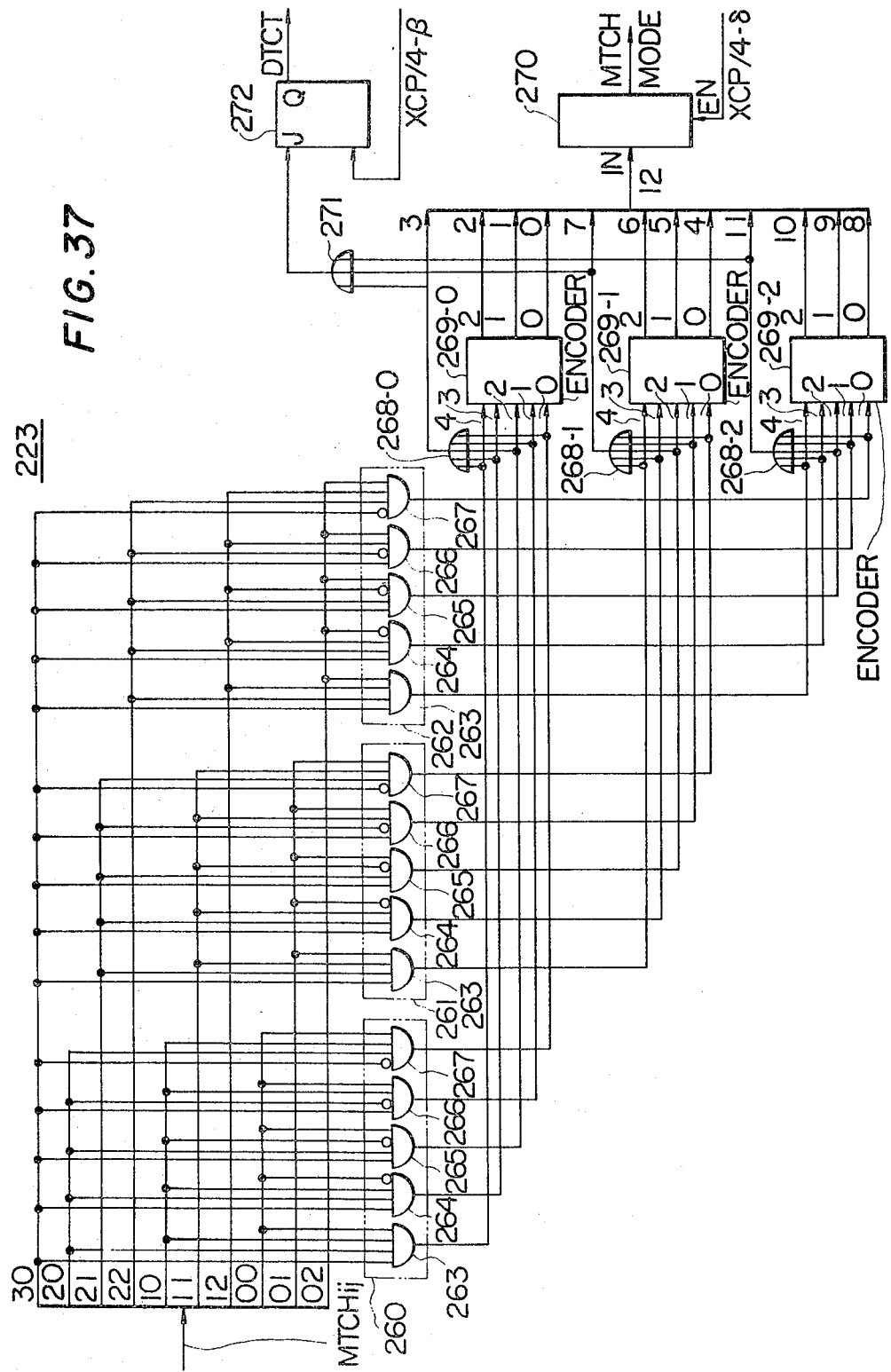
FIG. 37 shows a construction of an example of a matching mode decision circuit in the construction of FIG. 34.

FIG. 37 shows an example of the matching mode decision circuit 223 of FIG. 34. The illustrated AND gate groups 260, 261 and 262 are adapted to decide whether the matchings are obtained in more than three of the four partial pattern matching. Among the gate groups, AND gate 263 is adapted to output "1" when the matchings are obtained in all of the four partial pattern matchings excepting one corresponding to the template 73-0 of FIG. 13.

Similarly, AND gates 265, 266 and 267 are adapted to output "1", when the matchings are obtained in three partial pattern matchings, excepting ones corresponding to the templates 73-1, 73-2 and 73-3, respectively.

The AND gate groups 260, 261 and 262 correspond to a group pattern matchings in cases of the distances between the templates are represented by $(Kx-1)\times(Ky-1)$, $Kx\times Ky$ and $(Kx+1)\times(Ky+1)$.

The outputs from respective AND gate circuit groups 260, 261 and 262 are OR-processed by an OR gate 268 and is encoded into 3 bits by an encoder 269.

The output from the OR gate 268 occupying one bit and the code of the encoder 269 occupying three bits, thus occupying 4 bits in sum, are stored temporarily by a latch register 270, for respective one of the three kinds of template-distances, i.e. $3\times4=12$ bits in total.

The outputs from three OR gates 268-0 to 268-2 are OR-processed by an OR gate 271. This means that at least one of the gates outputs "1", i.e. the detection of the pad.

Therefore, a flip-flop 272 is set to turn the signal DTCT to "1". The output from the latch register 270 represents the manner of matching, and is transferred to the memory buffer of FIG. 34, as a signal MTCH MODE.

Figure 38:
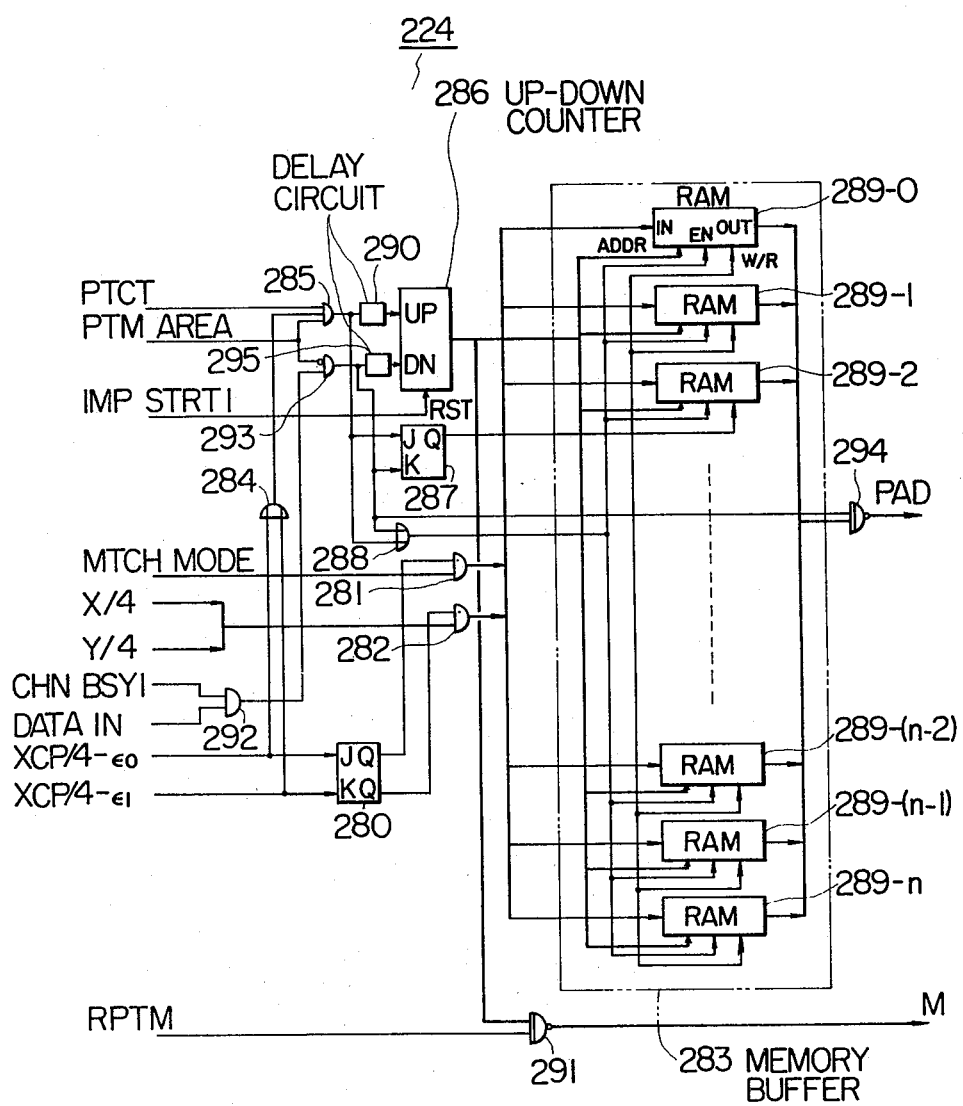
FIG. 38 shows a construction of an example of a memory buffer of the construction of FIG. 34.
Figure 39:
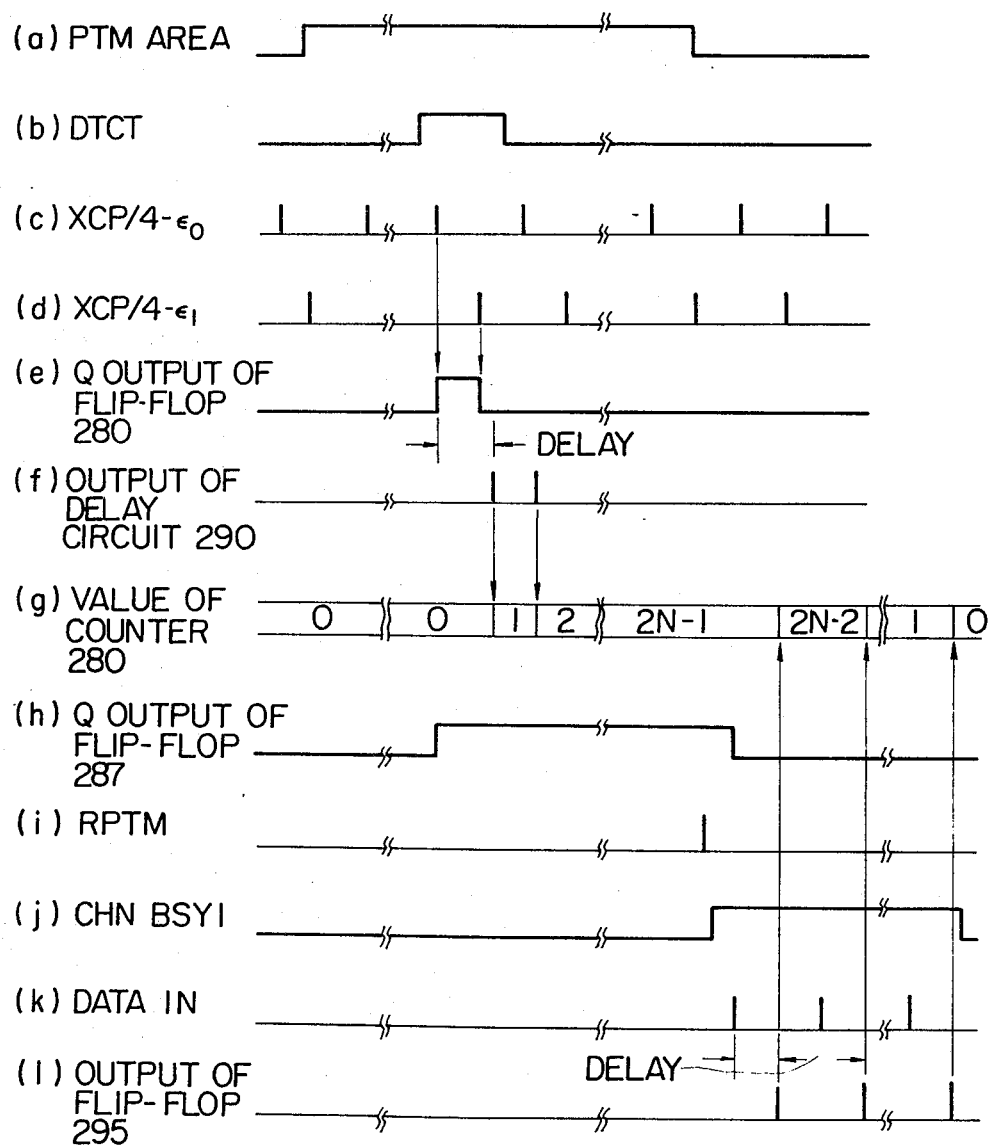
FIG. 39 shows a timing chart for explaining the operation of the memory buffer of FIG. 38.

FIG. 38 shows an example of the memory buffer 224 of FIG. 34, while FIG. 39 shows a timing chart for explaining the operation of the memory buffer of FIG. 38.

When a pad is detected, it is necessary to transfer the cordinates of the pad (X/4, Y/4), as well as the signal MTCH MODE representative of the manner of matching as explained above with reference to FIG. 36, to the computer.

When the pad is detected, i.e. when the signal DTCT of FIG. 39(b) is "1", in a state that, as at (a), the signal PTM AREA from domain gate circuit 225 of FIG. 34 is "1", a flip-flop 280 is set as shown at (c) of FIG. 39, provided that the clock signal XCP/4-ϵ is obtained as at (c) of FIG. 39.

Consequently, AND gate 281 is opened, so that the signal MTCH MODE from the matching mode decision circuit of FIG. 37 is allowed to be delivered to a memory buffer 283. Supposing that a clock signal XCP/4-ϵ, is provided as at (d) of FIG. 39, the flip-flop 280 is reset to open AND gate 282 so as to allow the binary data of coordinates (X/4, Y/4) to be sent to the memory buffer 283.

It is to be noted here that the flip-flop 280 is reset for each arrival of the clock signal XCP/4-ϵ, although only specific condition thereof as mentioned above is illustrated.

As will be seen from FIG. 39, at (c) and (d), clock signals XCP/4-ϵ, and XCP/4-ϵ, are issued one by one, at an interval of the signal DTCT="1". Therefore, the value of an up-down counter 286 is increased by two, as shown at (g), for each time DTCT assumes "1", by means of an OR gate 284, AND gate 285 and a delay circuit 289.

FIG. 39(f) shows the output from the delay circuit 290.

Referring now to the memory buffer 283, it is composed of a plurality of RAMs 289-0 to 289-n, as will be seen from FIG. 38. Respective bits of signal MTCH MODE or (X/4, Y/4) correspond to respective one of the RAMs.

Supposing that pulses are delivered from the AND gate 285, flip-flop 287 is set as shown in FIG. 39(h) to command the writing operation, so that pulses from OR gate 288 are written as a strobe in the address of RAM 289 which is a content of the updown counter 286.

The delay circuit 290 is intended for making the address of RAM to start from 0, synchronously with the first writing strobe pulse.

Consequently, signals MTCH MODE and (X/4, Y/4) are successively stored in the addresses of even and odd numbers, of the RAM, respectively.

Concerning the reading operation, the content of the up-down counter 286 (this is 2 N, when the number of detected pads is 2) is read out by the computer, as a signal M, through an AND gate 291, when an instruction RPTM of FIG. 39(i) (See FIG. 26) is issued.

Accordingly, the computer reads the 2 N data at a high speed, by means of the channel controller.

Thus, reading strobe pulse DATA IN of FIG. 39(k) and a signal CHN BSY1 are input to an AND gate 292. This reading strobe pulse is allowed to pass an AND gate 293, under a condition that the signal PTM AREA of FIG. 39(a) being "0", so as to count down the up-down counter 286, after having been delayed by a delay circuit 295, as shown in FIG. 39(l).

At the same time, the flip-flop 287 is reset to command the RAM 289 to operate for reading, so that the successive reading is performed from the address of the RAM 289 which is the content of the up-down counter 286, as signals PAD, through an AND gate 294 by means of a strobe constituted by the pulses from the OR gate 288.

The delay circuit 295 is intended for making the address of RAM 289 set at 2N−1, at the timing of the first strobe pulse.

Consequently, the contents of addresses 2N−1 to 0 are successively read out by this reading operation.

The group pattern matching circuit is constituted by the above circuit components.

Figure 40:
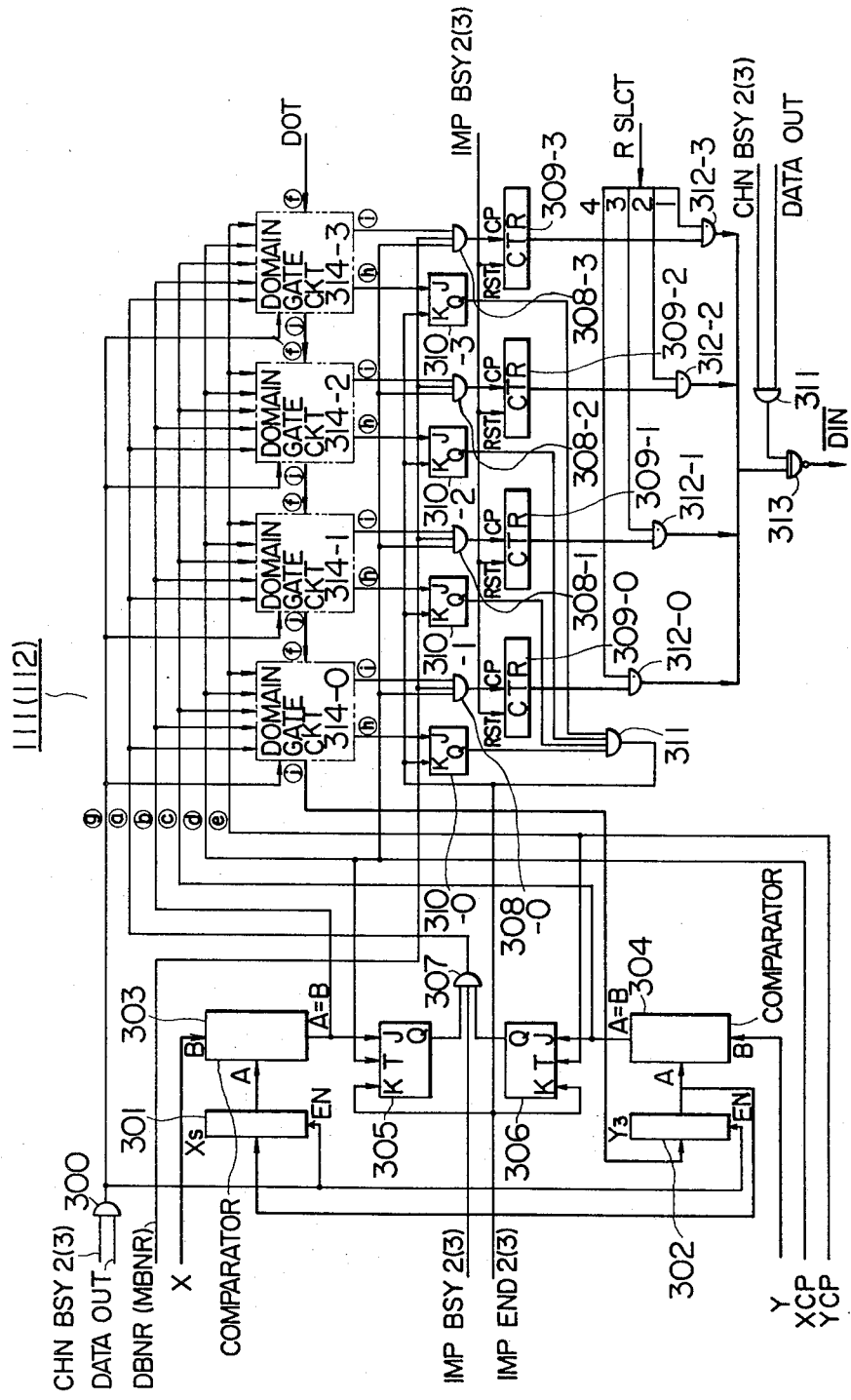
FIG. 40 shows a construction of an example of the "white" area counter in the construction of FIG. 21.

FIG. 40 shows an example of the white area counter group D 111 of FIG. 21 (or white area counter group M 112). Since both of the counter groups D and M are of the same construction, reference numeral out of brackets denote parts for the counter group D, while numerals in the brackets are for the counter group M.

The parameter writing of this circuit is performed also under the control of the channel controller. Namely, signals CHN BSY2(3) and DATA OUT are delivered to an AND gate 300, the output from which is used as the writing strobe for serially writing the data DOT into domain gate circuits 314-3 to 314-0 and into latch registers 302, 301, as shown in Figure.

Figure 16:
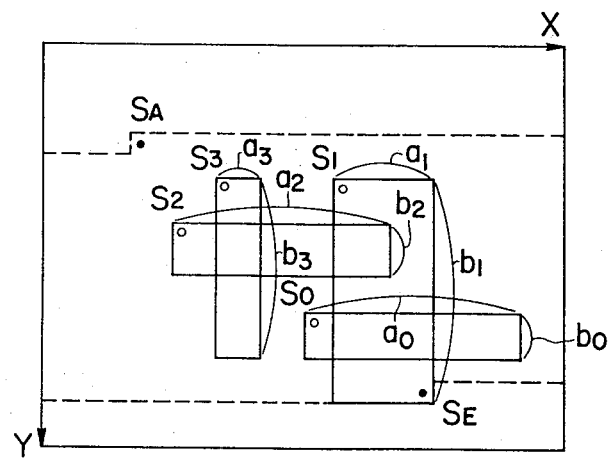
FIG. 16 shows a group of rectangular domains determined for "white area" counting and a domain gate.

It should be noted, however, that the data of the latch registers 301 and 302 are the coordinate Xs and Ys of FIG. 16 (mode 1).

The domain gate circuits 314-0 to 314-3 may be constituted by the circuits as shown in FIG. 29, respectively.

Comparators 303 and 304 compares the coordinate (X, Y) now scanned with Xs, Ys. When X and Y become Xs and Ys, X and Y counters in the domain gate circuit 314 is set by the signals for the terminals b and c, and, at the same time, flip-flops 305 and 306 are reset.

Consequently, when the signal IMP BSY2(3) assumes "1", an AND gate 307 is opened at the timing of X=Xs and Y=Ys, so that all domain gate circuits are started by the signal available at the terminal a. Meanwhile, X and Y counters of all domain gate circuits are started by the clock signals XCP and YCP (clock pulses of mode 1) which are to be delivered to the terminals d and e.

Respective domain gate circuits performs scanning on the domains shown in FIG. 16. During the scanning, when the terminal i comes to bear "1", the clock signal XCP is issued, so that the counter 309 is allowed to perform the counting when the objective pattern is white, i.e. when the signal DBNR (MBNR) is "1".

As the domain gate circuits 314 terminates their scanning, they issue pulses representative of the termination, through the terminal h, so as to set the flip-flop 310. The AND gate 311 is turned to bear "1", at the instant when all of the flip-flops 310 are set, and the flip-flops 305, 306 and 310 are reset, to provide the signal IMP END2(3).

The white area So, S1, S2 and S3 for respective domain are obtained in this manner, and are read out in sequence by the channel controller.

Namely, signals CHN BSY2(3) and DATA In are put into an AND gate 311, the output from the gate 311 is used as the reading strobe. Data selected at an AND gate 312 are successively read out, by means of this strobe, through a NAND gate 313. The counters 309-0 to 309-3 are reset by the signal IMP BSY2(3).

Figure 41:
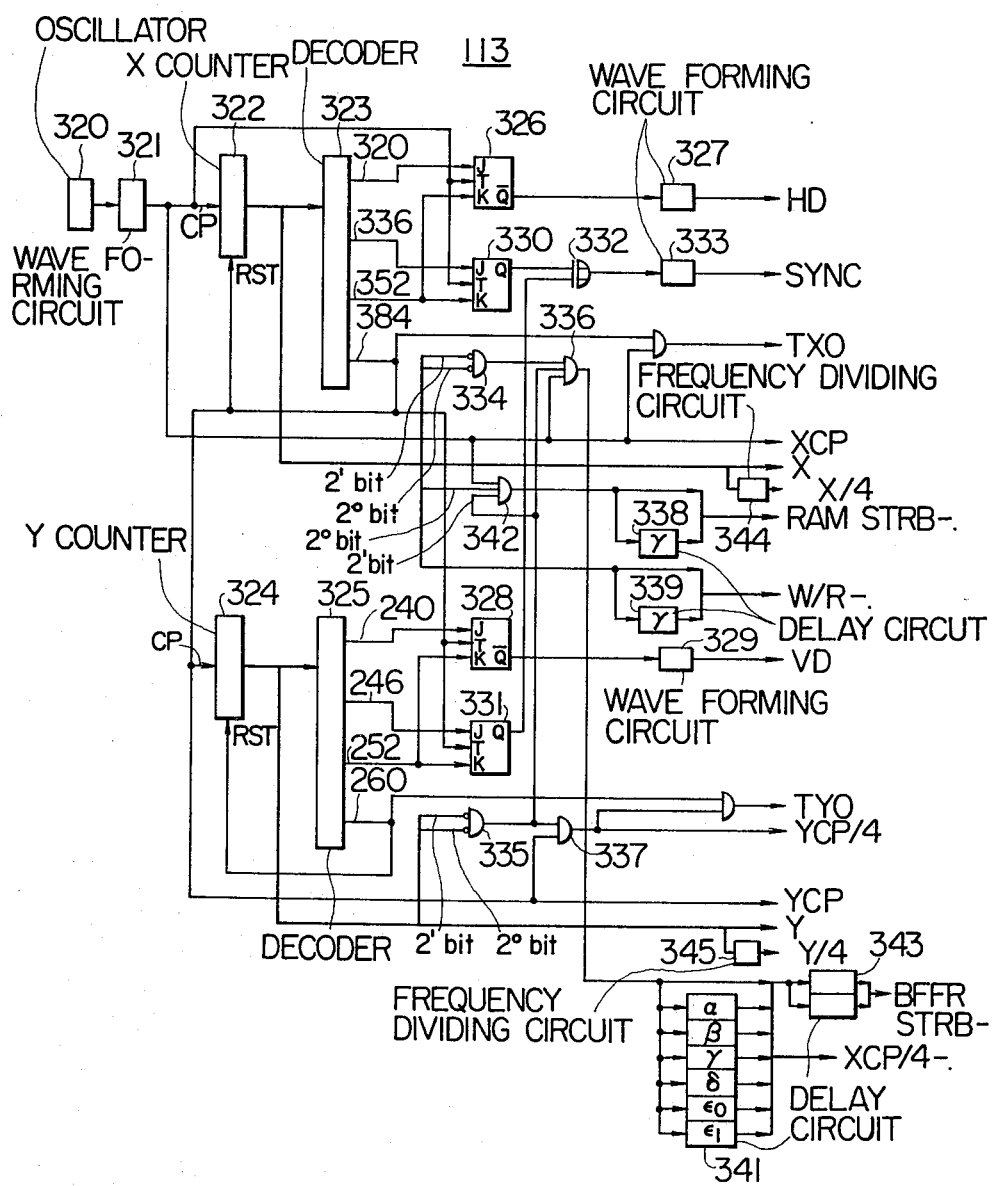
FIG. 41 shows a construction of a synchronized signal distributing circuit in the construction of FIG. 21.

FIG. 41 shows an example of the synchronizing distribution circuit 113 of FIG. 41.

In the Figure, numeral 320 denotes a pulse oscillator of 6 MHz, and 321 denotes a wave forming circuit for trimming the pulse width. X and Y counters 323 and 324 and decoders 323 and 325 are connected in the illustrated manner.

XCP represents the output from the wave forming circuit 321, thus being of 6 MHz, while YCP is pulse signal having pulses issued at each time the output from the decoder 323 becomes 384, i.e. of 15.7 KHz.

Outer synchronizing signals HD and VD are otained by flip-flops 326 and 328 and wave forming circuits (for level and polarity inverting) 327 and 329. The outer synchronizing signal SYNC for monitor is obtained through flip-flops 330 and 331, EOR circuit 352 and a wave forming circuits 327 and 329 (for level and polarity inverting).

XCP/4 represents a sampling clock pulse of mode 4, and is obtained, by means of AND gates 334, 335 and 336, only when the value counted by the Y counter 324 is a multiple of 4, and for each time that the value counted by the X counter 322 becomes a multiple of 4.

The sampling clock pulse CPY/4 of mode 4 is obtained through AND gates 335 and 337, only once when the value counted by the Y counter 324 comes a multiple of 4.

An AND gate 342 provides a signal RAM STRB which is delayed by a delay circuit 338 to provide a signal RAM STRB-γ. The signal W/R is obtained from the output of the X counter 322, and is delayed by a delay circuit 339 to become a signal W/R-γ.

The signals BFFR STRB and BFFR STRB-γ are obtained by delaying the signal XCP/4 by a delaying circuit 343.

Similarly, signals XCP/4-α,β,γ,δ,ε,ε, are obtained by delaying circuit 341. Signal TXo, TYo are issued when X and Y are Xo and Yo, i.e. at the time of starting of the scanning.

The coordinates of the scanning point are obtained through output from X and Y counters 322 and 324, respectively, while signals X/4 and Y/4 are obtained by frequency-deviding these outputs by frequency dividing circuits 344 and 345.

Figure 42:
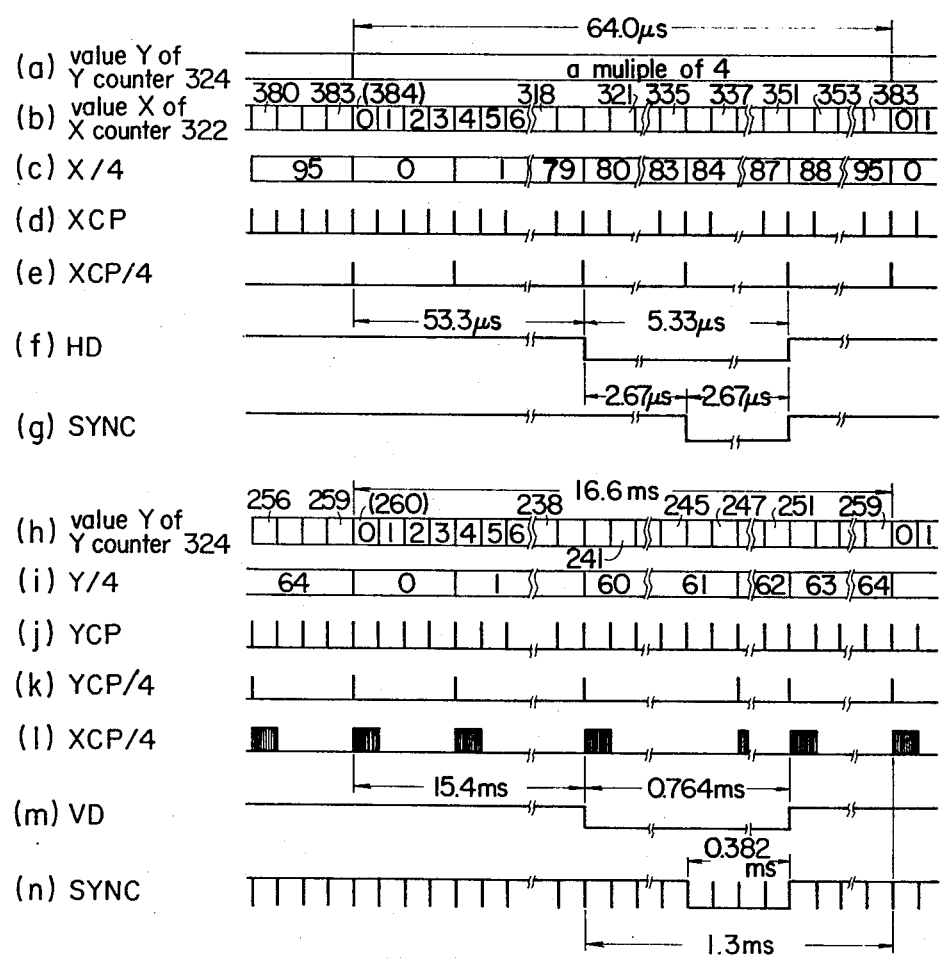
FIGS. 42 and 43 shows timing charts for explaining the operation of the circuit of FIG. 41.

FIG. 42 shows a timing chart explaining the manner of operation of the essential part of the circuit of FIG. 41.

In this Figure, (a) designates at a value Y of the Y counter 324, (b) a value X of the X counter 322, (c) the value X/4, (d) a clock signal XCP/4, (f) and (g) denote the outer synchronizing signals HD and SYNC, (h) designates at the value Y of the Y counter 324 (includes the value of (a) above with a smaller scale), (i) the value Y/4, (j) the clock signal XCP/4 (includes the value of (e) above with smaller scale), and (m) and (n) denote outer synchronizing signals VD and SYNC.

Figure 43:
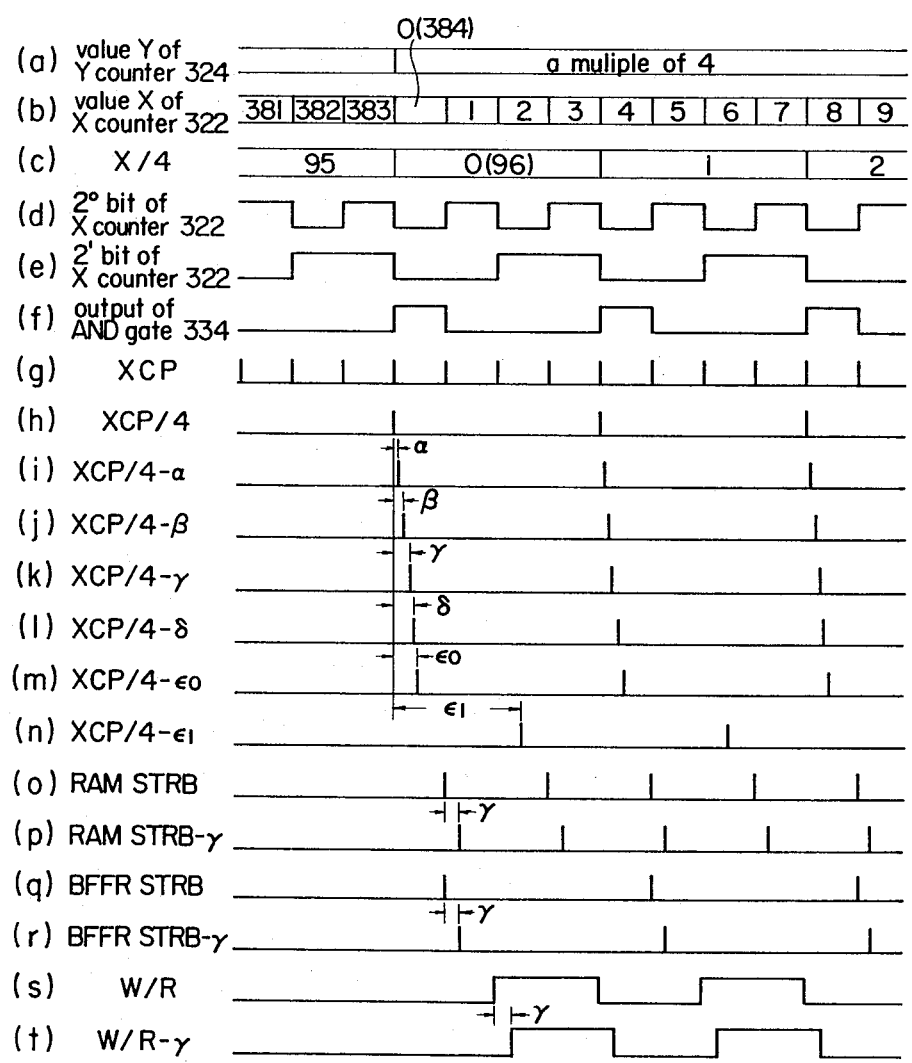

Referring to FIG. 43 showing a further detail of the circuit of FIG. 42, (a) denotes the value of the Y counter 324, (b) denotes the value of the X counter 322, (c) the value X/4, (d) and (e) represent the outputs from the 2°th and 2'th bits of the X counter 322, (f) the output from AND gate 334, (g) the signal XCP, (h) the signal XCP/4, (i) the signal XCP/4-α, (j) the signal XCP/4-β, (k) the signal XCP/4-γ, (l) the signal XCP/4-δ, (m) the signal XCP/4-ε, (n) the signal XCP/4-ε, (o) the signal RAM STRB, (p) the signal RAM STRB-γ, (q) the signal BFFR STRB, (r) the signal BFFR STRB-γ, (s) the signal W/R, and (t) denotes the signal W/R-γ.

What is claimed is:

1. A system for detecting the position of an object comprising:

first means for photo-electrically converting at least one portion image in said object;

second means connected to said first means and adapted to detect an approximate position of a specific pattern of said portion image photo-electrically converted by said first means by determining the coincidence of said specific pattern with a standard mask pattern; and third means connected to said first and second means for examining the area of the specific brightness of each of the images of a plurality of regions within said portion image corresponding to said approximate position of the specific pattern detected by said second means to detect the exact position of said specific pattern.

2. A system as claimed in claim 1, characterized by further comprising fourth means connected between said first and second means, for turning an analogue video signal obtained through said first means into a binary signal using a predetermined threshold value, and fifth means connected to said first means to calculate said threshold value from said analogue video signal obtained through said first means.

3. A system as claimed in claim 1, characterized by further comprising sixth means connected to said first and second means for examining images of a plurality of regions in said portion image corresponding to said position detected by said second means, thereby to detect the direction of said specific pattern.

4. A system as claimed in claim 1, characterized by further comprising seventh means for enlarging said portion image and inputting the enlarged image into said first means.

5. A system for detecting the position of an object comprising:

photo-electric converting means adapted to convert at least one portion image of said object into an analogue video signal; thresholding means for converting said analogue video signal from said photo-electric converting means into a corresponding binary signal by means of a threshold value first detecting means adapted for performing a coarse sampling of said binary signal thereby to detect the approximate position of a specific pattern in said portion image; and second detecting means adapted for performing a fine sampling of said binary signal from said thresholding means, so as to examine the brightnesses of a plurality of regions in said portion image corresponding to said position obtained by said first detecting means.

6. A system as claimed in claim 5, characterized by further comprising threshold calculating means for calculating the threshold value for said thresholding means from said analogue signal obtained through said photoelectric converting means.

7. A system as claimed in claim 6, wherein said threshold calculating means comprises means for calculating said threshold value in accordance with a signal of a level between predetermined two signal levels of said analogue signal.

8. A system as claimed in claim 6, wherein said threshold calculating means includes a converting means for converting said analogue signal into a digital signal, first and second signal integrating means adapted for integrating said digital signals of levels above and below a predetermined level, respectively, and first and second time integrating means adapted for integrating the times of said digital signals of levels above and below said predetermined level, respectively.

9. A system as claimed in claim 5, characterized by further comprising optical means for enlarging said portion image and inputting the enlarged portion image into said photo-electric converting means.

10. A system as claimed in claim 5, wherein said photo-electric converting means comprises means for converting a plurality of portion images in said object into analogue video signals.

11. A system as claimed in claim 5, characterized by further comprising means for intermittently shifting the position of said object, and processing means for processing said object in accordance with positional informations given by said second detecting means.

12. A system as claimed in claim 5, wherein said second detecting means comprises means for detecting the exact position of said specific pattern through obtaining the area within said regions of a specific signal level.

13. A system as claimed in claim 5, characterized by further comprising third detecting means adapted to perform a fine sampling of said binary signal from said thresholding means, to examine the brightness of a plurality of regions in said portion image corresponding to said position detected by said first detecting means thereby to detect the direction of the specific pattern.

14. A system as claimed in claim 13, wherein said third detecting means comprises means for detecting the direction of said specific pattern through obtaining the area in said regions of a specific signal level.

15. A system as claimed in claim 5, wherein said first detecting means comprises means for detecting a matching of a standard pattern including a plurality of regions of a specific pattern and spaced from each other by a specific distance, with the pattern of said portion image.

16. A system as claimed in claim 15, wherein said first detecting means comprises means for providing a matching output, when the pattern of at least a part of said plurality of regions matches said pattern of said portion image.

17. A system as claimed in claim 5, wherein said first detecting means includes eliminating means for eliminating noises from said binary signal obtained through said thresholding means.

18. A system as claimed in claim 17, wherein said eliminating means comprises means for deciding that a level point is of a specific level, when the area of signals of said specific level within a specific region including the points of said binary signal exceeds a predetermined area.

19. A system as claimed in claim 5, wherein said first detecting means include a plurality of extracting means for extracting a plurality of region patterns from said binary portion image, and matching detecting means for detecting the matching of said region patterns with a standard pattern.

20. A system as claimed in claim 19, wherein said extracting means are constituted by memory buffers.

21. A system as claimed in claim 19, wherein said matching detecting means include first logical means for providing an exclusive OR of said region patterns extracted by said extracting means and a standard pattern, and second logical means for providing a logical AND of the output from said first logical means and a mask pattern.

22. A system as claimed in claim 19, wherein said matching detecting means comprises means for providing a matching signal when at least a part of said plurality of regions matches said standard pattern.

23. A system for detecting the position of an object comprising:

photo-electric converting means for converting at least one portion image of said object into a video signal;

first detecting means for detecting the approximate position of a specific pattern in said portion image through a coarse sampling of the video signal; and second detecting means for detecting the exact position of the specific pattern through a fine sampling of the video signal on the basis of the position detected by said first detecting means.

24. A system as claimed in claim 23, characterized by further comprising thresholding means for converting said video signal from said converting means into a binary signal by means of a threshold value.

25. A system as claimed in claim 24, characterized by further comprising calculating means for calculating said threshold value on the basis of said video signal obtained by said converting means.

* * * * *